United States Patent
Lee et al.

(10) Patent No.: US 9,530,519 B2
(45) Date of Patent: Dec. 27, 2016

(54) SCAN DRIVER AND DISPLAY DEVICE INCLUDING THE SAME

(71) Applicant: Samsung Display Co., Ltd., Yongin, Gyeonggi-Do (KR)

(72) Inventors: Jae-Sic Lee, Yongin (KR); Hyun Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 104 days.

(21) Appl. No.: 13/949,153

(22) Filed: Jul. 23, 2013

(65) Prior Publication Data
US 2014/0111490 A1    Apr. 24, 2014

(30) Foreign Application Priority Data
Oct. 24, 2012 (KR) .......................... 10-2012-0118557

(51) Int. Cl.
G09G 5/00  (2006.01)
G11C 19/28 (2006.01)
G09G 3/32  (2016.01)

(52) U.S. Cl.
CPC ............. *G11C 19/28* (2013.01); *G09G 3/3266* (2013.01); *G09G 2310/0286* (2013.01)

(58) Field of Classification Search
USPC .... 345/204, 211, 76, 214, 212, 690, 67, 103
See application file for complete search history.

(56) References Cited

U.S. PATENT DOCUMENTS

| 2002/0196244 A1* | 12/2002 | Satoh .................... G06F 3/14 345/204 |
| 2005/0253799 A1* | 11/2005 | Kamio ................ G09G 3/3614 345/103 |
| 2006/0164360 A1* | 7/2006 | Wakabayashi ....... G09G 3/3266 345/94 |
| 2008/0043009 A1* | 2/2008 | Kim .................... G09G 3/3622 345/211 |

(Continued)

FOREIGN PATENT DOCUMENTS

| KR | 10-2012-0019227 A | 3/2012 |
| KR | 10-2012-0028006 A | 3/2012 |
| KR | 10-2012-0091880 A | 8/2012 |

OTHER PUBLICATIONS

EPO Search Report dated Feb. 6, 2014, for corresponding European Patent application 13185331.9, (7 pages).

*Primary Examiner* — Thuy Pardo
(74) *Attorney, Agent, or Firm* — Lewis Roca Rothgerber Christie LLP

(57) ABSTRACT

A scan driver and a display device including the scan driver are provided. The scan driver is configured to drive a plurality of pixels with a plurality of gate signals and includes a plurality of stages, each of the stages including one or more regions, each of the regions including: a plurality of sub-drivers configured to generate ones of the gate signals and to transmit the ones of the gate signals to ones of the pixels; and a driver commonly coupled to the sub-drivers and configured to concurrently supply a common signal to each of the sub-drivers, the driver of the one or more regions being configured to receive the common signal of one of the one or more regions of a previous one of the stages during forward direction driving or of a next one of the stages during reverse direction driving.

29 Claims, 8 Drawing Sheets

(56) References Cited

U.S. PATENT DOCUMENTS

| | | | |
|---|---|---|---|
| 2009/0160849 A1* | 6/2009 | Kiya | G09G 3/2007 345/214 |
| 2009/0160882 A1* | 6/2009 | Kiya | G09G 3/2007 345/690 |
| 2010/0156762 A1* | 6/2010 | Choi | 345/76 |
| 2011/0164017 A1 | 7/2011 | Chung | |
| 2012/0007847 A1* | 1/2012 | Kanazawa | H01J 40/14 345/211 |
| 2012/0062525 A1 | 3/2012 | Kim | |
| 2012/0105420 A1* | 5/2012 | Choi | 345/212 |
| 2012/0139886 A1 | 6/2012 | Lee et al. | |
| 2012/0242644 A1* | 9/2012 | Liu et al. | 345/212 |

* cited by examiner

SCAN DRIVER AND DISPLAY DEVICE INCLUDING THE SAME

CROSS-REFERENCE TO RELATED APPLICATION

This application claims priority to and the benefit of Korean Patent Application No. 10-2012-0118557, filed in the Korean Intellectual Property Office on Oct. 24, 2012, the entire content of which is incorporated herein by reference.

BACKGROUND (a) Field

Aspects of embodiments of the present invention relate to a scan driver and a display device including the scan driver.

(b) Description of the Related Art

Among flat panel displays, the organic light emitting diode (OLED) display, which displays images by using OLEDs that generate light by recombining electrons and holes, has a fast response speed, low power consumption, and excellent emission efficiency, luminance, and viewing angle, such that usage thereof has recently been expanded. Generally, the OLED display is classified as a passive matrix OLED (PMOLED) or an active matrix OLED (AMOLED) according to a driving method of the OLEDs.

The PMOLED uses a method in which an anode and a cathode are formed to cross each other and cathode lines and anode lines are selectively driven. In contrast, the AMOLED uses a method in which a thin film transistor and a capacitor are integrated in each pixel and a voltage is maintained by a capacitor. The PMOLED has a simple structure and a low cost. However, it is difficult to realize a PMOLED panel of a large size or high accuracy. In contrast, with the AMOLED it is possible to realize a panel of a large size or high accuracy. However, it is difficult to technically realize the control method of the AMOLED display, which results in a comparatively higher cost than the PMOLED display.

In terms of resolution, contrast, and operation speed, the current trend is toward the AMOLED display where respective unit pixels selectively turn on or off. The AMOLED display may include a display panel including a plurality of pixels arranged in a matrix format and driving circuits transmitting image data signals and scan signals to the pixels to display an image. In addition, the driving circuits may include a data driver transmitting the image data signals through data lines connected to the pixels and a scan driver transmitting scan signals through scan lines connected to the pixels for activating each of the pixels to display the image according to a respective one of the image data signals.

In general, the scan driver has a complicated circuit structure to sequentially transmit correct scan signals to the pixels included in the display panel for each pixel line such that an area occupied by the scan driver is large in comparison to the other driving circuits. In addition, when manufacturing a high resolution display device integrating a large number of pixels for the same panel size, space that cannot be used by other circuits (such as dead space) is increased by a circuit area that is occupied by the scan driver such that it is difficult to manufacture the display device to be ultra-light and as a thin film display device.

The above information disclosed in this Background section is only for enhancement of understanding of the background of the present invention and therefore it may contain information that does not form the prior art that is already known in this country to a person of ordinary skill in the art.

SUMMARY

An exemplary embodiment of the present invention provides for an ultra-light display device using thin film technology by reducing a circuit area of a scan driver and dead space that cannot be used. Another exemplary embodiment of the present invention increases a production yield of the display device by reducing a number of circuit elements to reduce the circuit area of the scan driver.

In an exemplary embodiment according to the present invention, a scan driver is provided. The scan driver is configured to drive a plurality of pixels with a plurality of gate signals. The scan driver includes a plurality of stages. Each of the stages includes one or more regions. Each of the regions includes a plurality of sub-drivers configured to generate ones of the gate signals and to transmit the ones of the gate signals to ones of the pixels, and a driver commonly coupled to the sub-drivers and configured to concurrently supply a common signal to each of the sub-drivers, the driver of one of the one or more regions being configured to receive the common signal of one of the one or more regions of a previous one of the stages during forward direction driving or of a next one of the stages during reverse direction driving.

The gate signals may include a plurality of first gate signals for transmitting to a plurality of first gate lines and a plurality of second gate signals for transmitting to a plurality of second gate lines. The pixels may be arranged in a plurality of pixel lines coupled to the first gate lines and to the second gate lines. The one or more regions may include a first region including a first driver commonly coupled to a plurality of first sub-drivers configured to transmit ones of the first gate signals to ones of the first gate lines coupled to ones of the pixel lines, and a second region including a second driver commonly coupled to a plurality of second sub-drivers configured to transmit ones of the second gate signals to ones of the second gate lines coupled to the ones of the pixel lines.

The first driver may be configured to concurrently supply a first common signal to each of the first sub-drivers. The second driver may be configured to concurrently supply a second common signal to each of the second sub-drivers. The first sub-drivers may include a first sub-driver configured to generate and transmit a first of the first gate signals to a first of the first gate lines coupled to a first pixel line of the pixel lines, and a second sub-driver configured to generate and transmit a second of the first gate signals to a second of the first gate lines coupled to a second pixel line of the pixel lines that is adjacent to the first pixel line. The second sub-drivers may include a third sub-driver configured to generate and transmit a first of the second gate signals to a first of the second gate lines coupled to the first pixel line, and a fourth sub-driver configured to generate and transmit a second of the second gate signals to a second of the second gate lines coupled to the second pixel line.

Each of the sub-drivers may include a boosting transistor configured to generate one of the gate signals, and a capacitor including two terminals coupled between a gate and a source of the boosting transistor, the capacitor being configured to maintain a potential difference between the two terminals.

The first driver may be configured to receive a driving start signal, a driving direction control signal, a first clock signal, and a first initialization signal. The second driver may be configured to receive the first common signal, a second clock signal, and a second initialization signal.

The driving start signal may be a forward direction driving start signal for the first driver of a first stage of the stages during the forward direction driving, and may be a reverse direction driving start signal for the first driver of a final stage of the stages during the reverse direction driving.

The driving direction control signal may include a forward direction driving control signal and a reverse direction driving control signal. The forward direction driving control signal and the reverse direction driving control signal may be configured to be received by the first driver as fixed voltages having reversed polarities.

The first sub-driver may be further configured to receive a first sub-clock signal and to transmit the first of the first gate signals according to the first sub-clock signal. The second sub-driver may be further configured to receive a second sub-clock signal and to transmit the second of the first gate signals according to the second sub-clock signal. The third sub-driver may be further configured to receive the second sub-clock signal and to transmit the first of the second gate signals according to the second sub-clock signal. The fourth sub-driver may be further configured to receive the first sub-clock signal and to transmit the second of the second gate signals according to the first sub-clock signal.

Each of the first sub-clock signal and the second sub-clock signal may be driven with a period of two horizontal periods. The second sub-clock signal may have a phase difference of one horizontal period with respect to the first sub-clock signal.

The first driver may be configured to receive a first clock signal. The second driver is configured to receive a second clock signal. The first sub-driver and the second sub-driver may be further configured to respectively sequentially output the first of the first gate signals and the second of the first gate signals after the first driver receives the first clock signal. The third sub-driver and the fourth sub-driver may be further configured to respectively sequentially output the first of the second gate signals and the second of the second gate signals after the second driver receives the second clock signal.

The first driver of a first stage of the stages and the first driver of a final stage of the stages may be configured to receive a driving start signal. The third sub-driver of one of the first stage or the final stage may be configured to transmit the first of the second gate signals of the one of the first stage or the final stage within one horizontal period after the first driver of the one of the first stage or the final stage has finished receiving the driving start signal.

The first driver may be configured to receive a first initialization signal and change a voltage value of the first common signal according to the received first initialization signal to stop an operation of the first sub-driver and the second sub-driver. The second driver may be configured to receive a second initialization signal and change a voltage value of the second common signal according to the received second initialization signal to stop the operation of the third sub-driver and the fourth sub-driver.

The first driver in a first stage of the stages may include a first switch configured to turn on according to a forward direction driving control signal to transmit a pulse voltage of a forward direction driving start signal, a second switch configured to turn on according to a reverse direction driving control signal to transmit the second common signal of a second stage of the stages, a third switch configured to turn on according to a first clock signal to transmit one of the pulse voltage of the forward direction driving start signal or the second common signal of the second stage as the first common signal, a fourth switch configured to turn on according to the one of the pulse voltage of the forward direction driving start signal or the second common signal of the second stage to transmit a first voltage of a high level to a first node, a fifth switch and a sixth switch configured to turn on according to a voltage value of the first node to transmit the first voltage as the first common signal, a capacitor coupled to the first node and to a supply source of the first voltage, a seventh switch configured to turn on according to the voltage value of the first node to transmit the first voltage as the first of the first gate signals to the first of the first gate lines coupled to the first pixel line, an eighth switch configured to turn on according to the voltage value of the first node to transmit the first voltage as the second of the first gate signals to the second of the first gate lines coupled to the second pixel line, and a ninth switch configured to turn on according to a first initialization signal to transmit a second voltage of a low level to the first node.

The second driver in a first stage of the stages may include a first switch configured to turn on according to a second clock signal to transmit the first common signal as the second common signal, a second switch configured to turn on according to the first common signal to transmit a first voltage of a high level to a first node, a third switch and a fourth switch configured to turn on according to a voltage value of the first node to transmit the first voltage as the second common signal, a capacitor coupled to the first node and to a supply source of the first voltage, a fifth switch configured to turn on according to the voltage value of the first node to transmit the first voltage as the first of the second gate signals to the first of the second gate lines coupled to the first pixel line, a sixth switch configured to turn on according to the voltage value of the first node to transmit the first voltage as the second of the second gate signals to the second of the second gate lines coupled to the second pixel line, and a seventh switch configured to turn on according to a second initialization signal to transmit a second voltage of a low level to the first node.

The first gate signals may be configured to initialize the pixels by resetting data voltages stored in the pixels according to image data signals transmitted to the pixels during a previous frame. The second gate signals may be configured to compensate threshold voltages of driving transistors of the pixels and to store data voltages in the pixels according to image data signals transmitted to the pixels during a current frame.

The first driver may be configured to concurrently supply a first common signal to each of the first sub-drivers. The second driver may be configured to concurrently supply a second common signal to each of the second sub-drivers. The first sub-drivers may include a first sub-driver configured to generate and transmit a first of the first gate signals to a first of the first gate lines coupled to a first pixel line of the pixel lines, a second sub-driver configured to generate and transmit a second of the first gate signals to a second of the first gate lines coupled to a second pixel line of the pixel lines that is adjacent to the first pixel line, a third sub-driver configured to generate and transmit a third of the first gate signals to a third of the first gate lines coupled to a third pixel line of the pixel lines that is adjacent to the second pixel line, and a fourth sub-driver configured to generate and transmit a fourth of the first gate signals to a fourth of the first gate lines coupled to a fourth pixel line of the pixel lines that is adjacent to the third pixel line. The second sub-drivers may include a fifth sub-driver configured to generate and transmit a first of the second gate signals to a first of the second gate lines coupled to the first pixel line, a sixth sub-driver configured to generate and transmit a second of the second gate signals to a second of the second gate lines coupled to the second pixel line, a seventh sub-driver configured to generate and transmit a third of the second gate signals to a third of the second gate lines coupled to the third pixel line, and an eighth sub-driver configured to generate and transmit a fourth of the second gate signals to a fourth of the second gate lines coupled to the fourth pixel line.

The first sub-driver, the second sub-driver, the third sub-driver, and the fourth sub-driver may be further configured to respectively sequentially receive a first sub-clock signal, a second sub-clock signal, a third sub-clock signal, and a fourth sub-clock signal, and to respectively sequentially transmit the first of the first gate signals, the second of the first gate signals, the third of the first gate signals, and the fourth of the first gate signals according to the first sub-clock signal, the second sub-clock signal, the third sub-clock signal, and the fourth sub-clock signal, respectively. The fifth sub-driver, the sixth sub-driver, the seventh sub-driver, and the eighth sub-driver may be further configured to respectively sequentially receive the second sub-clock signal, the third sub-clock signal, the fourth sub-clock signal, and the first sub-clock signal, and to respectively sequentially transmit the first of the second gate signals, the second of the second gate signals, the third of the second gate signals, and the fourth of the second gate signals according to the second sub-clock signal, the third sub-clock signal, the fourth sub-clock signal, and the first sub-clock signal, respectively.

Each of the first sub-clock signal, the second sub-clock signal, the third sub-clock signal, and the fourth sub-clock signal may be driven with a period of four horizontal periods. The second sub-clock signal may have a phase difference of one horizontal period with respect to the first sub-clock signal. The third sub-clock signal may have a phase difference of one horizontal period with respect to the second clock signal and two horizontal periods with respect to the first clock signal. The fourth sub-clock signal may have a phase difference of two horizontal periods with respect to the second sub-clock signal.

The first driver may be configured to receive a first clock signal. The second driver may be configured to receive a second clock signal. The first sub-driver, the second sub-driver, the third sub-driver, and the fourth sub-driver may be further configured to respectively sequentially output the first of the first gate signals, the second of the first gate signals, the third of the first gate signals, and the fourth of the first gate signals after the first driver receives the first clock signal. The fifth sub-driver, theسادس sub-driver, the seventh sub-driver, and the eighth sub-driver may be further configured to respectively sequentially output the first of the second gate signals, the second of the second gate signals, the third of the second gate signals, and the fourth of the second gate signals after the second driver receives the second clock signal.

The first driver of a first stage of the stages and the first driver of a final stage of the stages may be configured to receive a driving start signal. The fifth sub-driver of one of the first stage or the final stage may be configured to transmit the first of the second gate signals of the one of the first stage or the final stage within one horizontal period after the first driver of the one of the first stage or the final stage has finished receiving the driving start signal.

The first driver may be configured to receive a first initialization signal and change a voltage value of the first common signal according to the received first initialization signal to stop an operation of the first sub-driver, the second sub-driver, the third sub-driver, and the fourth sub-driver. The second driver may be configured to receive a second initialization signal and change a voltage value of the second common signal according to the received second initialization signal to stop the operation of the fifth sub-driver, the sixth sub-driver, the seventh sub-driver, and the eighth sub-driver.

In another exemplary embodiment of the present invention, a display device is provided. The display device includes a display unit including a plurality of pixels, a scan driver configured to transmit a plurality of first gate signals and a plurality of second gate signals to the pixels, a data driver configured to transmit image data signals to the pixels, a light emission control driver configured to transmit light emission control signals to the pixels, and a controller configured to generate a plurality of control signals to control driving of the scan driver, the data driver, and the light emission control driver. The scan driver includes a plurality of stages. Each of the stages includes a plurality of first sub-drivers configured to generate ones of the first gate signals, a plurality of second sub-drivers configured to generate ones of the second gate signals, a first driver commonly coupled to the first sub-drivers and configured to concurrently supply a first common signal to each of the first sub-drivers, and a second driver commonly coupled to the second sub-drivers and configured to concurrently supply a second common signal to each of the second sub-drivers. The first driver is configured to receive the second common signal of a previous one of the stages during forward direction driving or of a next one of the stages during reverse direction driving.

The controller may be configured to generate and transmit a forward direction driving control signal or a reverse direction driving control signal for determining a driving direction of the scan driver from among the control signals. The forward direction driving control signal and the reverse direction driving control signal may be configured to be transmitted as fixed voltages having reversed polarities.

The pixels may be arranged in a plurality of pixel lines corresponding to the first sub-drivers of the stages and to the second sub-drivers of the stages. The first sub-drivers may be configured to transmit ones of the first gate signals to respective ones of the pixel lines. The second sub-drivers may be configured to transmit ones of the second gate signals to the respective ones of the pixel lines.

The first sub-drivers may include a first sub-driver configured to generate and transmit a first of the first gate signals to a first pixel line of the pixel lines, and a second sub-driver configured to generate and transmit a second of the first gate signals to a second pixel line of the pixel lines that is adjacent to the first pixel line. The second sub-drivers may include a third sub-driver configured to generate and transmit a first of the second gate signals to the first pixel line, and a fourth sub-driver configured to generate and transmit a second of the second gate signals to the second pixel line.

The first sub-drivers may include four first sub-drivers respectively configured to generate and transmit ones of the first gate signals to four adjacent ones of the pixel lines. The second sub-drivers may include four second sub-drivers respectively configured to generate and transmit ones of the second gate signals to the four adjacent ones of the pixel lines.

Each of the first sub-drivers and the second sub-drivers may include a boosting transistor configured to generate a respective one or the first gate signals or the second gate signals, and a capacitor including two terminals coupled between a gate and a source of the boosting transistor and configured to maintain a potential difference between the two terminals.

The first gate signals may be configured to initialize the pixels by resetting data voltages stored as gate voltages of driving transistors in the pixels according to image data signals transmitted to the pixels during a previous frame. The second gate signals may be configured to control switching operation of switching transistors of the pixels for transmitting image data signals to the pixels during a current frame, and control switching operation of threshold voltage compensation transistors of the pixels.

The scan driver may be further configured to generate and transmit each of the first gate signals to respective ones of the pixels earlier than generating and transmitting a respective one of the second gate signals to the respective ones of the pixels.

According to the above and other embodiments of the present invention, a circuit area of the scan driver may be reduced, thereby reducing a number of circuit elements forming the scan driver, and furthermore reducing dead space that cannot be used in a high-resolution display device. In addition, the layout space of the display device may be relatively increased by a reduction of the circuit area occupied by the scan driver such that design freedom may be increased. Further, the production yield of the display device may be improved by a reduction of the number of the circuit elements of the scan driver.

DETAILED DESCRIPTION

Figure 1:
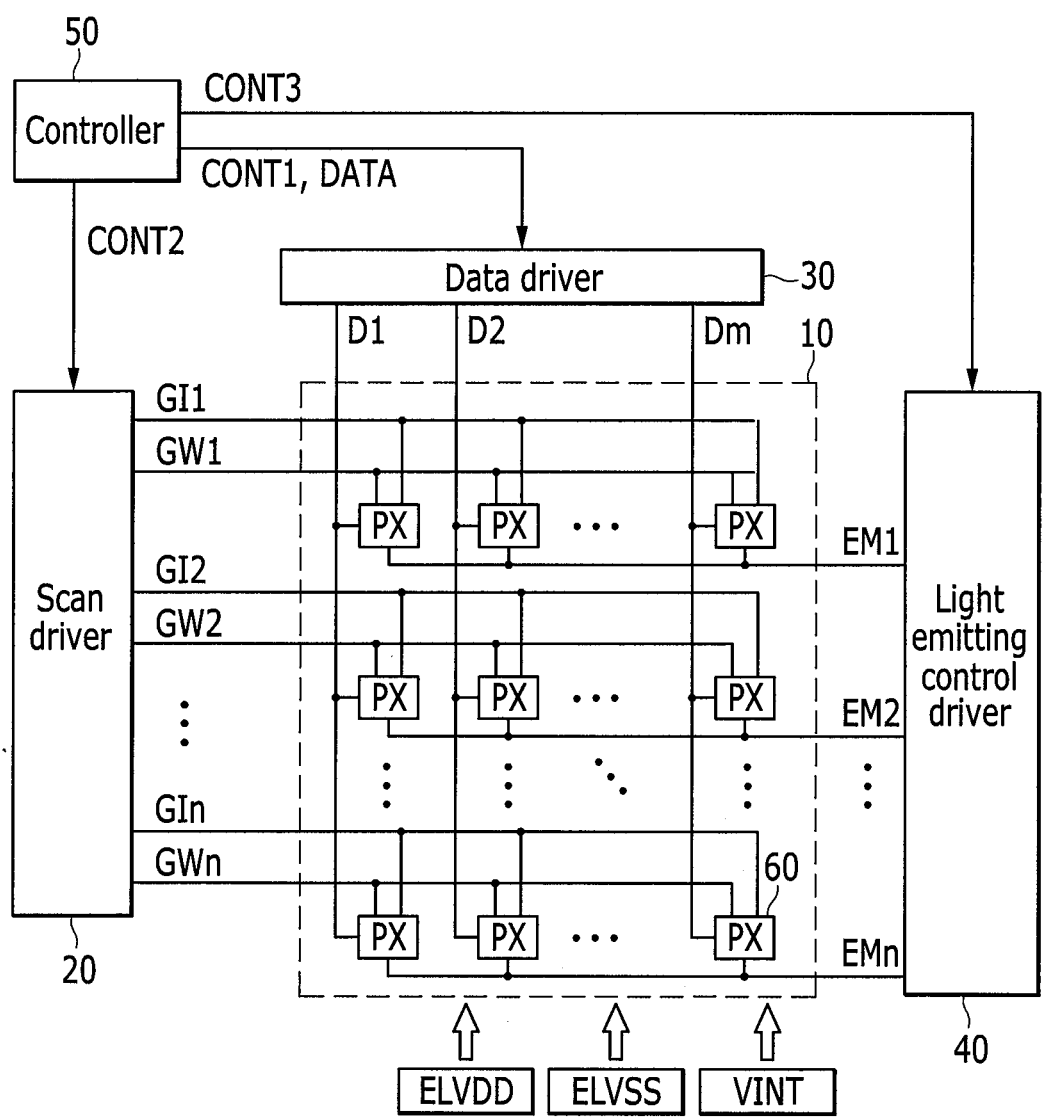
FIG. 1 is a block diagram of a display device according to an exemplary embodiment of the present invention.

Hereinafter, the present invention will be described more fully with reference to the accompanying drawings, in which exemplary embodiments of the invention are shown. As those skilled in the art would realize, the described exemplary embodiments may be modified in various different ways, all without departing from the spirit or scope of the present invention. Constituent elements having the same structures throughout the embodiments are denoted by the same reference numerals and are described in a first embodiment. In the other embodiments, only constituent elements other than the same constituent elements are described.

Throughout this specification and the claims that follow, when it is described that an element is "coupled" to another element, the element may be directly coupled (for example, connected) to the other element or indirectly coupled (for example, electrically connected) to the other element through one or more third other elements. In addition, unless explicitly described to the contrary, the word "comprise" and variations such as "comprises" or "comprising" will be understood to imply the inclusion of stated elements but not the exclusion of any other elements.

FIG. 1 is a block diagram of a display device according to an exemplary embodiment of the present invention.

Referring to FIG. 1, the display device includes a display unit 10, a scan driver 20, a data driver 30, a light emission control driver 40, and a controller 50. The display unit 10 includes a plurality of pixels 60 approximately arranged in a matrix. The pixels 60 are coupled to a plurality of first gate lines Gl1 to Gln, a plurality of second gate lines GW1 to GWn, a plurality of light emission control lines EM1 to EMn, and a plurality of data lines D1 to Dm.

In further detail, each of the pixels 60 is respectively coupled to a corresponding one of the first gate lines Gl1 to Gln, one of the second gate lines GW1 to GWn, one of the light emission control lines EM1 to EMn, and one of the data lines D1 to Dm. Each of the pixels 60 includes a light emitting element for emitting light according to electrical signals and a driving circuit for controlling light emitting of the light emitting element. Accordingly, the pixels 60 may be sequentially activated in rows (or pixel lines), where for each pixel line, the pixels 60 in the pixel line receive the image data signals corresponding to pixels 60 in the pixel line to emit light, thereby displaying the image for the input video signals.

Each of the pixels 60 initializes (for example, resets) the stored data voltage of the data signal of the previous frame upon receiving a signal (such as a first gate signal) transmitted through the corresponding one of the first gate lines Gl1 to Gln. The pixels 60 are then sequentially activated (for example, by pixel lines) in the current frame by a signal (such as a second gate signal) transmitted through the corresponding one of the second gate lines GW1 to GWn to receive the corresponding data signal of the current frame. The data signal corresponding to each pixel 60 is transmitted through the corresponding one of the data lines D1 to Dm coupled to the pixel 60.

The display unit 10 is supplied with a first power source voltage ELVDD of a set potential (for example, a predetermined high potential) and a second power source voltage ELVSS of a set potential (for example, a predetermined low potential) as a power source voltages for driving each of the pixels 60. In addition, an initialization voltage VINT for initializing (for example, resetting) the stored data voltage of the image data signal that was written in the previous frame is supplied to the display unit 10 for each frame. The first power source voltage ELVDD, the second power source voltage ELVSS, the initialization voltage VINT, etc., may be transmitted through power source wires coupled to each pixel 60 of the display unit 10 from a power supply unit.

The scan driver 20 is coupled to the first gate lines Gl1 to Gln and the second gate lines GW1 to GWn respectively coupled to pixel lines of the display unit 10. The scan driver 20 generates a plurality of first gate signals and transmits them to each pixel line of the display unit 10 through the first gate lines Gl1 to Gln, and generates a plurality of second gate signals and transmits them to each pixel line of the display unit 10 through the second gate lines GW1 to GWn. The generation and transmission of the output signals of the scan driver 20 may be controlled according to the scan driving control signal CONT2 transmitted from the controller 50.

The data driver 30 is coupled to the data lines D1 to Dm coupled to the pixels 60 (for example, in columns) of the display unit 10. Accordingly, the data voltages of a plurality of image data signals are transmitted to each pixel 60 of the display unit 10 through the data lines D1 to Dm. To this end, a plurality of image data signals DATA are supplied from an external image source and transmitted to the data driver 30 after image processing in the controller 50. The operation of the data driver 30 is controlled according to the data driving control signal CONT1 and the image data signals DATA transmitted from the controller 50.

The light emission control driver 40 is coupled to the light emission control lines EM1 to EMn coupled to the pixel lines of the display unit 10. The light emission control driver 40 generates a plurality of light emission control signals and transmits them to the pixel lines of the display unit 10 through the light emission control lines EM1 to EMn. The light emission control signals control the light emitting element included in each pixel 60 to emit light to display the image. The generation and transmission of the light emission control signals of the light emission control driver 40 may be controlled according to the light emitting driving control signal CONT3 transmitted from the controller 50.

The controller 50 generates and transmits the driving control signals for controlling the operation of the scan driver 20, the data driver 30, and the light emission control driver 40. In addition, the controller 50 performs a compensation process such as for luminance and color temperature corresponding to the display unit for video signals transmitted from an external image source to be processed into appropriate image data signals DATA and to transmit the image data signals DATA to the data driver 30.

In further detail, the controller 50 generates the data driving control signal CONT1 for controlling the operation of the data driver 30 and transmits it to the data driver 30. In addition, the controller 50 generates the scan driving control signal CONT2 for controlling the operation of the scan driver 20 and transmits it to the scan driver 20. For example, the scan driving control signal CONT2 may include a forward direction driving start signal and a reverse direction driving start signal for starting a driving direction (for example, at the start of a new frame) of the scan driver 20. Further, the scan driving control signal CONT2 may include a forward direction driving control signal and a reverse direction driving control signal for controlling the driving direction of the scan driver 20 (for example, throughout the frame).

For example, the scan driver 20 may receive the forward direction driving start signal and sequentially generate the output signals (for example, the first gate signals and the second gate signals) in one driving direction (e.g., the forward direction) by the control of the forward direction driving control signal. In contrast, the scan driver 20 may receive the reverse direction driving start signal and sequentially generate the output signals in the reverse direction by control of the reverse direction driving control signal. Exemplary detailed processes for generating the output signals of the scan driver 20 under control of the scan driving control signal CONT2 are described below with reference to FIGS. 3-8.

Figure 2:
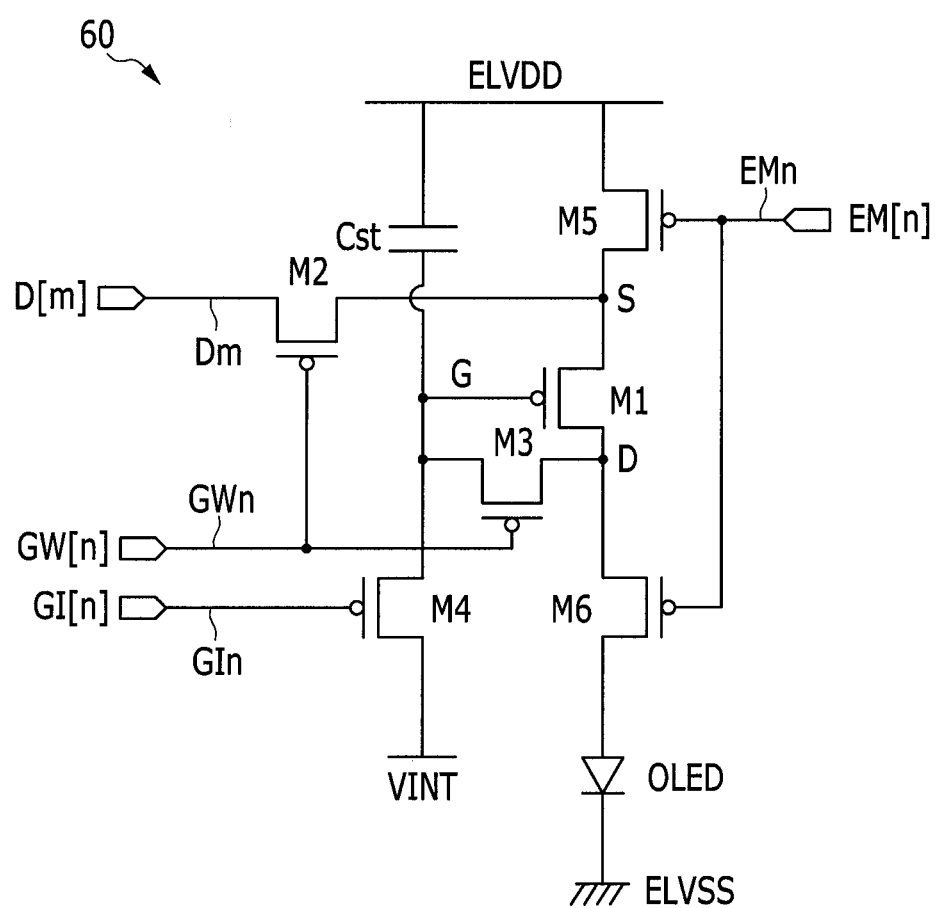
FIG. 2 is a circuit diagram of a pixel structure included in the display device shown in FIG. 1 according to an exemplary embodiment of the present invention.

FIG. 2 is a circuit diagram of a pixel 60 of the display device of FIG. 1 according to an exemplary embodiment of the present invention. The pixel 60 is driven according to output signals transmitted from the scan driver 20, the data driver 30, and the light emitting control driver 40 included in the display device shown in FIG. 1.

The pixel 60 shown in FIG. 2 is positioned at the n-th pixel line of the pixel lines and the m-th pixel column of a plurality of pixel columns included in the display unit 10. The pixel 60 is coupled to the scan driver 20 through the n-th first gate line Gln and the n-th second gate line GWn coupled to the n-th pixel line. In addition, the pixel 60 is coupled to the light emission control driver 40 through the n-th light emission control line EMn and to the data driver 30 through the m-th data line Dm. Further, the pixel 60 is coupled to a voltage supply source supplying the first power source voltage ELVDD, the second power source voltage ELVSS, and the initialization voltage VINT through the power supply wires.

The pixel 60 shown in FIG. 2 includes six transistors and one capacitor. However, this is but one exemplary embodiment and the present invention is not limited to this circuit structure. The transistors forming the pixel 60 are PMOS transistors. However, they may be realized, for example, by NMOS transistors in other embodiments.

In further detail, the pixel 60 includes an OLED as a light emitting element, and includes a driving transistor M1, a switching transistor M2, a threshold voltage compensation transistor M3, an initialization transistor M4, and first and second light emission control transistors M5 and M6 as the driving circuit. In addition, the driving circuit further includes a storage capacitor Cst coupled between a gate electrode of the driving transistor M1 and a supply source of the first power source voltage ELVDD.

The driving transistor M1 includes the gate electrode coupled to the node G, the source electrode coupled to the node S, and the drain electrode coupled to the node D. The driving transistor M1 controls the flow of the driving current from the first power source voltage ELVDD, through the OLED, and to the second power source voltage ELVSS according to the data voltage corresponding to the image data signal supplied to the node S to emit light thereby displaying the image.

The switching transistor M2 includes the gate electrode coupled to the n-th second gate line GWn, the source electrode coupled to the m-th data line Dm, and the drain electrode coupled to the node S. The switching transistor M2 transmits the corresponding image data signal D[m] transmitted through the m-th data line Dm to the node S in response to the n-th second gate signal GW[n] transmitted through the n-th second gate line GWn.

The threshold voltage compensation transistor M3 includes the gate electrode coupled to the n-th second gate line GWn, the first electrode coupled to the node D, and the second electrode coupled to the node G. The threshold voltage compensation transistor M3 connects the node D and the node G in response to the n-th second gate signal GW[n] transmitted through the n-th second gate line GWn. That is, by diode-connecting the gate electrode and the drain electrode of the driving transistor M1, different threshold voltage variations of the driving transistor M1 are compensated for each of the pixels 60 included in the display unit 10 when displaying the image.

The initialization transistor M4 includes the gate electrode coupled to the n-th first gate line Gln, the source electrode coupled to the power supply wire supplying the initialization voltage VINT, and the drain electrode coupled to the node G. The initialization transistor M4 supplies the initialization voltage VINT to the node G in response to the n-th first gate signal Gl[n] transmitted through the n-th first gate line Gln. That is, by transmitting the initialization voltage VINT to the gate electrode of the driving transistor M1, the stored data voltage value of the data signal transmitted to the driving transistor M1 during the previous frame is initialized (for example, reset).

The light emission control transistors include the first light emission control transistor M5 and the second light emission control transistor M6, but this is only one exemplary embodiment, and the present invention is not limited to this structure. The first light emission control transistor M5 includes the gate electrode coupled to n-th light emission control line EMn, the source electrode coupled to the power supply wire supplying the first power source voltage ELVDD, and the drain electrode coupled to the node S. The second light emission control transistor M6 includes the gate electrode coupled to the n-th light emission control line EMn, the source electrode coupled to the node D, and the drain electrode coupled to the anode of the OLED.

The first light emission control transistor M5 and the second light emission control transistor M6 form a path of the driving current flowing from the first power source voltage ELVDD through the driving transistor M1 to the OLED in response to the n-th light emission control signal EM[n] transmitted through the n-th light emission control line EMn such that the OLED is controlled to emit light (for example, when to emit light) according to the corresponding image data signal. That is, a time that the first light emission control transistor M5 and the second light emission control transistor M6 are turned-on according to the n-th light emission control signal EM[n] is controlled such that a light emitting time in which the OLED emits light may be controlled.

The storage capacitor Cst includes one terminal coupled to the node G and the other terminal coupled to the power supply wire supplying the first power source voltage ELVDD. The storage capacitor Cst stores the voltage corresponding to the potential difference between the two terminals thereby maintaining the voltage value corresponding to the data voltage according to the image data signal supplied to the driving transistor M1 during the corresponding frame.

In an exemplary operation of the pixel 60 shown in FIG. 2, the first gate signal Gl[n] is transmitted earlier (for example, as a gate-on voltage level) than the second gate signal GW[n]. The scan driver 20 generates and transmits the first gate signal and then the second gate signal as output signals corresponding to each pixel 60.

The initialization transistor M4 of the pixel 60 is turned on in response to the n-th first gate signal Gl[n], and transmits the initialization voltage VINT to the node G to initialize (for example, reset) a stored data voltage corresponding to the image data signal stored in the storage capacitor Cst coupled to the node G in the previous frame. Next, the switching transistor M2 is turned on in response to the n-th second gate signal GW[n] transmitted as the gate-on voltage level. Thus, the data voltage according to the image data signal D[m] corresponding to the current frame is supplied to the node S.

The threshold voltage compensation transistor M3 is also turned on in response to the n-th second gate signal GW[n]. Accordingly, the gate electrode and the drain electrode of the driving transistor M1 are diode-connected. Thus, a voltage difference Vdata−Vth of the data voltage Vdata supplied to the source electrode (the node S) of the driving transistor M1 and the threshold voltage Vth of the driving transistor is supplied to the gate electrode (the node G) of the driving transistor M1. Accordingly, the storage capacitor Cst having one terminal coupled to the gate electrode (the node G) of the driving transistor M1 and the other terminal coupled to the first power source voltage ELVDD stores the voltage of the potential difference supplied to both terminals, thereby storing the threshold-voltage-compensated data voltage Vdata−Vth during the current frame.

Next, the first light emission control transistor M5 and the second light emission control transistor M6 are turned on in response to the n-th light emission control signal EM[n] transmitted to the first light emission control transistor M5 and the second light emission control transistor M6 as the gate-on voltage level, and the current path is formed from the first power source voltage ELVDD through the driving transistor M1 to the OLED. Consequently, the OLED emits light with luminance according to the driving current corresponding to the data voltage stored in the storage capacitor Cst. That is, the data voltage stored in the storage capacitor Cst is the threshold-voltage-compensated data voltage value Vdata−Vth such that the influence of the threshold voltage Vth may be excluded when the OLED emits light corresponding to the driving current.

Accordingly, when the OLED of the pixels 60 included in the display unit 10 emits light corresponding to the driving current amount, the threshold voltage variation of the driving transistor of each pixel 60 may be compensated.

Figure 3:
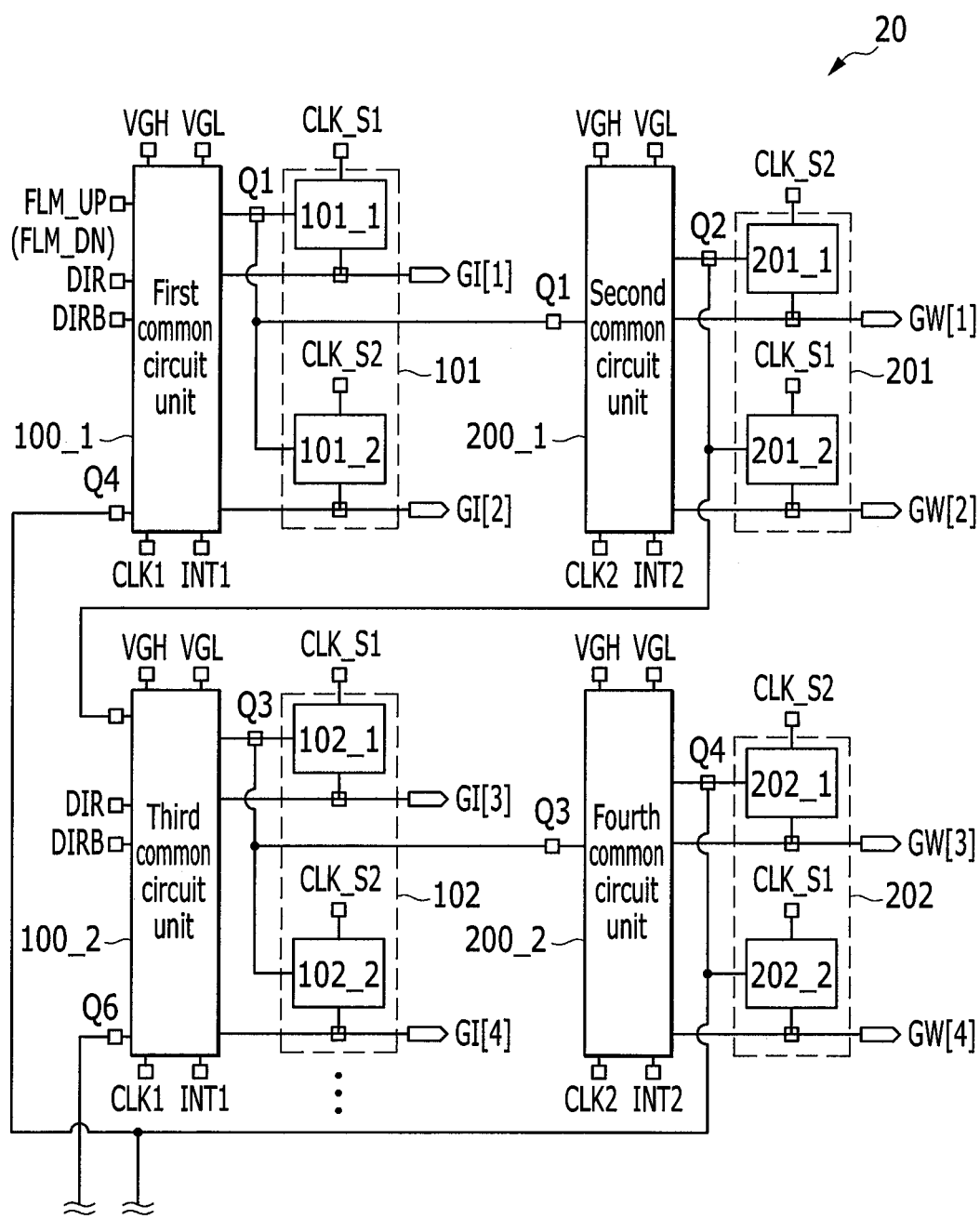
FIG. 3 is a block diagram showing a scan driver included in the display device shown in FIG. 1 according to an exemplary embodiment of the present invention.

FIG. 3 is a block diagram showing a scan driver 20 included in the display device shown in FIG. 1 according to an exemplary embodiment of the present invention.

Referring to FIG. 3, to reduce an area occupied by the scan driver 20 in the high resolution display device in which many pixels must be integrated into a panel having a set size (for example, a predetermined size), the scan driver 20 is divided into first, second, third, and fourth common circuit units (drivers) 100_1, 200_1, 100_2, and 200_2 and corresponding first, second, third, and fourth sub-regions 101, 201, 102, and 202, each of the first, second, third, and fourth sub-regions 101, 201, 102, and 202 containing a plurality of sub-drivers (for example, the first sub-region 101 contains the first sub-driver 101_1 and the second sub-driver 101_2). Each driver is common to (for example, shared by) the sub-drivers of its corresponding sub-region (for example, the first driver 100_1 is shared by the first sub-driver 101_1 and the second sub-driver 101_2).

The structure of the scan driver 20 of FIG. 3 relates to the portion of the scan driver 20 coupled to the first gate lines Gl1 to Gl4 and the second gate lines GW1 to GW4 that are respectively coupled to the first pixel line to the fourth pixel line among the pixel lines of the display unit 10. The first, second, third, and fourth drivers 100_1, 200_1, 100_2, and 200_2 include a shift register for supplying the first and second common signals to the corresponding sub-regions. In the exemplary embodiment of FIG. 3, each driver supplies its corresponding common signal to the two sub-drivers included in its corresponding sub-region.

The first, second, third, and fourth sub-regions 101, 201, 102, and 202 are for generating and transmitting the output signals of the scan driver 20. For instance, the first gate signals are generated and transmitted to each pixel line by sub-regions 101 and 102, while the second gate signals are generated and transmitted by sub-regions 201 and 202 to each pixel line.

The sub-regions (for example, first, second, third, and fourth sub-regions 101, 201, 102, and 202) each include at least two sub-drivers. Each sub-driver is coupled to the first gate line Gl or the second gate line GW coupled to the display unit for a respective one of the pixel lines. In FIG. 3, the scan driver 20 includes two sub-drivers for each pixel line, and generates and transmits the first gate signal and the second gate signal to the first gate line Gl and the second gate line GW using a different one of the sub-drivers.

In further detail, the exemplary embodiment of FIG. 3 represents the portion of the scan driver 20 coupled to the first gate lines Gl1 to Gl4 and the second gate lines GW1 to GW4 respectively coupled to the first to fourth pixel lines of the pixel lines included in the display unit 10. Referring to FIG. 3, the first common circuit unit (or first driver). 100_1 is commonly coupled to the first sub-driver 101_1 and the second sub-driver 101_2 as the first sub-region 101, and transmits a first common signal (through node Q1) to the first sub-driver 101_1 and the second sub-driver 101_2.

The first driver 100_1 receives a driving start signal (such as a reverse direction driving start signal FLM_UP or a forward direction driving start signal FLM_DN), a forward direction driving control signal DIR, a reverse direction driving control signal DIRB, the first clock signal CLK1, and the first initialization signal INT1 as input signals through input terminals. FIG. 3 shows the structure of the upper portion of the scan driver 20. For the lower portion of the scan driver 20, the reverse direction driving start signal FLM_UP is input as an input signal of the first driver (of the last stage or final stage), not the forward direction driving start signal FLM_DN.

In addition, for the driving voltages, the first voltage VGH of a set level (such as a predetermined high level) and the second voltage VGL of a set level (for example, a predetermined low level) are supplied. For example, the first voltage VGH of the high level may be a sufficiently high potential voltage for turning off the switches (such as PMOS transistors) at least forming the scan driver 20. The second voltage VGL of the low level may be a sufficiently low potential voltage for turning on the switches (such as PMOS transistors) at least forming the scan driver 20.

The first sub-driver 101_1 and the second sub-driver 101_2 are coupled to the first gate line Gl1 coupled to the first pixel line and the first gate line Gl2 coupled to the second pixel line, and respectively generate and transmit the first gate signal Gl[1] and the first gate signal Gl[2] to the pixels 60 included in the first pixel line and the pixels 60 included in the second pixel line. The first sub-driver 101_1 receives the first sub-clock signal CLK_S1 through an input terminal while the second sub-driver 101_2 receives the second sub-clock signal CLK_S2 through a corresponding input terminal.

The second driver 200_1 is part of the same stage as the first driver 100_1 (for example, drives the same pixel lines), and receives the first common signal supplied to the node Q1 from the first driver 100_1, and generates and supplies a second common signal through node Q2. In addition, the second driver 200_1 receives the second clock signal CLK2 and the second initialization signal INT2 as input signals. Further, the second driver 200_1 uses the first voltage VGH of the high level and the second voltage VGL of the low level as driving voltages.

The second driver 200_1 is commonly coupled to the third sub-driver 201_1 and the fourth sub-driver 201_2 of the second sub-region 201. The third sub-driver 201_1 and the fourth sub-driver 201_2 are respectively coupled to the second gate line GW1 coupled to the first pixel line and the second gate line GW2 coupled to the second pixel line, and respectively generate and transmit the second gate signal GW[1] to the pixels 60 included in the first pixel line and the second gate signal GW[2] to the pixels 60 included in the second pixel line.

The third sub-driver 201_1 receives the second sub-clock signal CLK_S2 through an input terminal while the fourth sub-driver 201_2 receives the first sub-clock signal CLK_S1 through a corresponding input terminal. Thus, the assignment of the first and second sub-clock signals CLK_S1 and CLK_S2 input to the two sub-drivers included in each of the first and second sub-regions 101 and 201 included in the same stage is switched between the sub-drivers of the different sub-regions. In addition, the second common signal supplied to the node Q2 of the second driver 200_1 is transmitted as an input signal of the third driver 100_2 of the next stage for activating the next stage during forward direction driving of the scan driver 20. For reverse direction driving of the scan driver 20, the common signal (in this case, the fourth common signal, transmitted through node Q4) of the last driver (in this case, the fourth driver 200_2) of the next stage (in this case, the second stage) becomes an input signal of the first driver 100_1 of the current stage. The fourth common signal of the node Q4 is input to the first driver 100_1 of the current stage when the scan driver 20 is driven in the reverse direction.

In FIG. 3, the structure of the next stage (the second stage) is not largely different from the first stage. The second stage is coupled to the first gate lines Gl3 and Gl4, and to the second gate lines GW3 and GW4 corresponding to the third pixel line and the fourth pixel line of the pixel lines of the display unit 10. The second stage includes the third driver 100_2 commonly coupled to the fifth sub-driver 102_1 and the sixth sub-driver 102_2 (through the node Q3), and the fourth driver 200_2 commonly coupled to the seventh sub-driver 202_1 and the eighth sub-driver 202_2 (through the node Q4).

The signal transmission of the second stage is similar to that of the first stage described above and will not be repeated. However, the fifth sub-driver 102_1 of the second stage outputs the first gate signal Gl[3] to the pixels 60 coupled to the third pixel line while the sixth sub-driver 102_2 outputs the first gate signal Gl[4] to the pixels 60 coupled to the fourth pixel line. In addition, the seventh sub-driver 202_1 of the second stage outputs the second gate signal GW[3] to the pixels 60 coupled to the third pixel line while the eighth sub-driver 202_2 outputs the second gate signal GW[4] to the pixels 60 coupled to the fourth pixel line.

Further, in the third driver 100_2, the third common signal supplied to the node Q3 commonly coupled to the fifth sub-driver 102_1 and the sixth sub-driver 102_2 is transmitted to the fourth driver 200_2 as an input signal. In addition, in the fourth driver 200_2, the fourth common signal supplied to the node Q4 commonly coupled to the seventh sub-driver 202_1 and the eighth sub-driver 202_2 is transmitted to the first driver 100_1 of the previous stage (for use in reverse direction driving) and the initial driver (or fifth driver, to keep the naming consistent in this embodiment) of the next stage (for use in forward direction driving) as an input signal.

The scan driver 20 is sequentially driven in the forward direction (from the upper portion to the lower portion) by this circuit configuration and signal transmission method, generating and transmitting the first gate signals and the second gate signals. In another exemplary embodiment, the scan driver 20 is sequentially driven in the reverse direction (from the lower portion to the upper portion) using the same circuit configuration and signal transmission method, this time according to a reverse direction driving start signal FLM_UP input to an initial driver of the last stage, generating and transmitting the first gate signals and the second gate signals to the pixel lines in the reverse order of the forward direction driving.

The scan driver 20 according to exemplary embodiments of the present invention concurrently transmits a common signal to multiple sub-drivers for generating respective ones of the first gate signals and the second gate signals such that the number of circuit elements may be reduced and the design of the signal wiring is simple, thereby reducing dead space that is not used in the display device.

Figure 4:
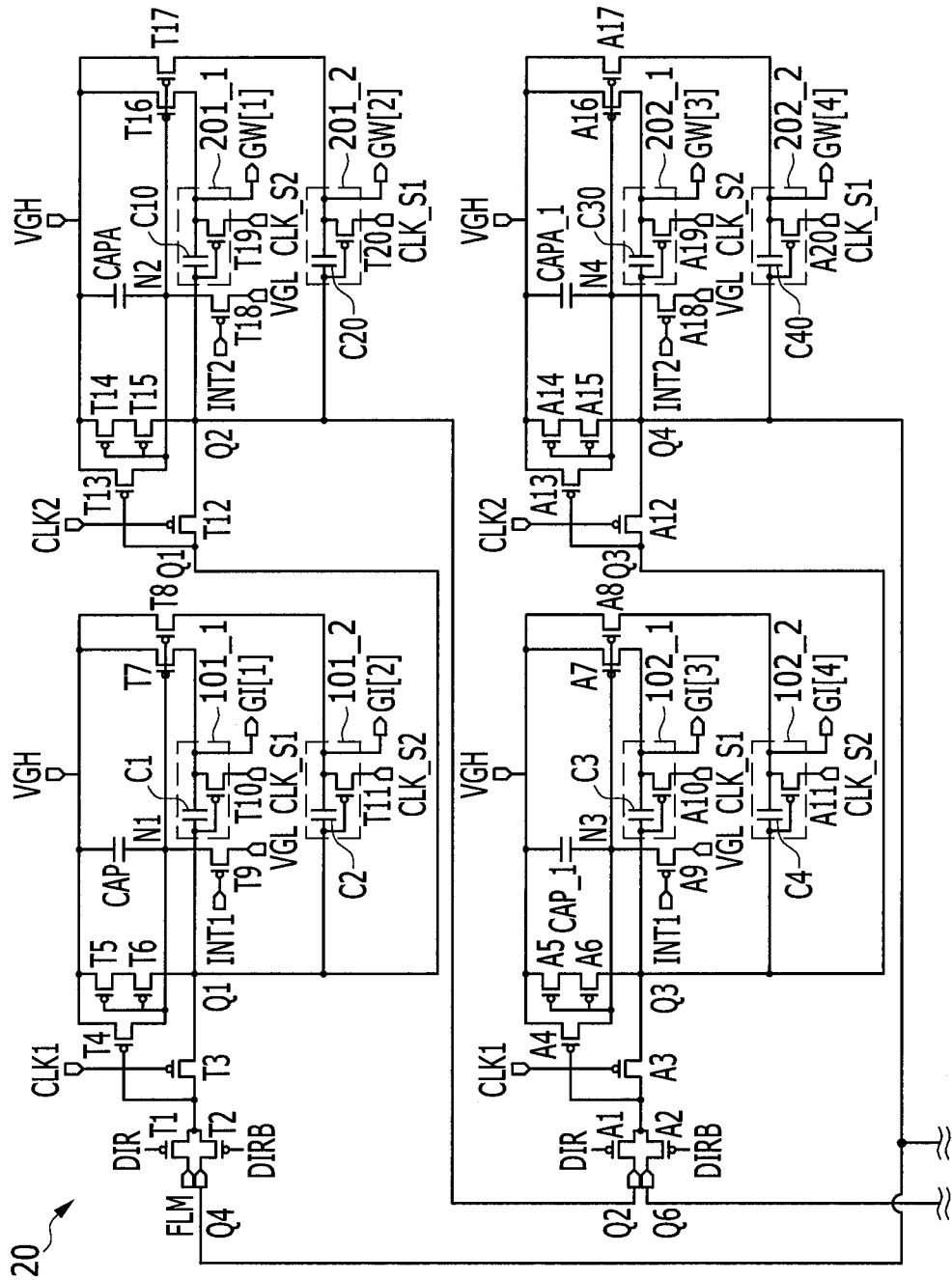
FIG. 4 is a circuit diagram of the scan driver shown in FIG. 3 according to an exemplary embodiment of the present invention.

FIG. 4 is a circuit diagram of the scan driver 20 shown in FIG. 3 according to an exemplary embodiment of the present invention.

The circuit diagram of FIG. 4, as shown in the block diagram of FIG. 3, represents two stages, that is, the first stage generating the first gate signals and the second gate signals corresponding to the first and second pixel lines of the display unit 10, and the second stage generating the first gate signals and the second gate signals corresponding to the third and fourth pixel lines. In FIG. 4, the first driver 100_1 of the first stage includes a plurality of switches T1 to T9. In addition, the second driver 200_1 of the first stage includes a plurality of switches T12 to T18. The third driver 100_2 of the second stage includes a plurality of switches A1 to A9. The fourth driver 200_2 of the second stage includes a plurality of switches A12 to A18.

Accordingly, referring to FIG. 4, each sub-driver includes at least one boosting switch (such as a boosting capacitor) and a capacitor, and sequentially transmits a corresponding signal transmitted through an input terminal (for example, an input terminal to a boosting switch) as the output signal according to timing. The input signals transmitted through the respective input terminals are the first sub-clock signal CLK_S1 and the second sub-clock signal CLK_S2. The two sub-clock signals respectively input to the two sub-drivers configured to generate and transmit the first gate signals in the same stage are switched with the two sub-clock signals input to the two sub-drivers configured to generate and transmit the second gate signals. For example, in the first stage of the scan driver 20 of FIG. 4, the two sub-drivers configured to generate and transmit the first gate signals, namely the first sub-driver 101_1 and the second sub-driver 101_2, are respectively input with the first sub-clock signal CLK_S1 and the second sub-clock signal CLK_S2 while the two sub-drivers configured to generate and transmit the second gate signals, namely the third sub-driver 201_1 and the fourth sub-driver 201_2, are respectively input with the second sub-clock signal CLK_S2 and the first sub-clock signal CLK_S1.

In further detail, the first driver 100_1 of the first stage includes the switches T1 to T9. For ease of description, the switches for forming the scan driver 20 are PMOS transistors. However, the present invention is not limited thereto.

The switch T1 transmits the driving start signal FLM in response to the forward direction driving control signal DIR. The scan driver 20 of FIG. 4 is a configuration of the upper portion such that the driving start signal FLM may be a forward direction driving start signal FLM_DN. However, in the configuration of the lower portion, the driving start signal FLM may be the reverse direction driving start signal FLM_UP. The signal output is reversed during reverse direction driving in response to the reverse direction driving control signal DIRB. The reverse direction driving may be easily comprehended from the forward direction driving such that a separate detailed description would be redundant and thus, is not provided.

The switch T2 is a switch for receiving the fourth common signal of the node Q4 of the fourth driver (200_2 of FIG. 3) as an input signal and transmitting the fourth common signal in response to the reverse direction driving control signal DIRB. The pulse voltage transmitted through the switch T1 or the switch T2 is transmitted to the gate electrode of the switch T4 while concurrently being transmitted to the source electrode of the switch T3.

The switch T3 transmits the pulse voltage transmitted through the switch T1 or the switch T2 as the first common signal to the node Q1 in response to the first clock signal CLK1. The switch T4 transmits the first voltage VGH as the driving voltage of the high potential in response to the pulse voltage transmitted through the switch T1 or the switch T2. In addition, the switch T5 and the switch T6 having the gate electrode coupled to the node N1 transmit the first voltage VGH to the node Q1 as the first common signal in response to the voltage value supplied to the node N1.

The capacitor CAP includes two terminals between a supply source for supplying the first voltage VGH and the node N1, and maintains the potential difference between the two terminals. Both terminals of the capacitor CAP are coupled between the gate electrode and the source electrode of the switch T7 and the switch T8 such that the turn-on state of the switches T7 and T8 is maintained and the switch T7 and the switch T8 may stably output the first gate signals Gl1 and Gl2 as the first voltage VGH in response to the voltage value of the node N1.

The gate electrode of the switch T7 is coupled to the node N1 and generates the first voltage VGH as an output signal in response to the voltage value supplied to the node N1. Thus, the first gate signal Gl[1] is transmitted to the first pixel line as the voltage value of the high level of the first voltage VGH. The gate electrode of the switch T8 is coupled to the node N1 and generates the first voltage VGH as an output signal in response to the voltage value supplied to the node N1. Thus, the switch T8 transmits the first gate signal Gl[2] to the second pixel line as the voltage value of the high level of the first voltage VGH.

The switch T9 transmits the second voltage VGL of the driving voltage of the low potential to the node N1 in response to the first initialization signal INT1. The on/off state of the switches T5, T6, T7, and T8 is determined according to whether the voltage supplied to the node N1 is the first voltage VGH or the second voltage VGL. For example, if the switches T5, T6, T7, and T8 are all turned on by the first initialization signal INT1, the first sub-driver 101_1 and the second sub-driver 101_2 are not operated (for example, they are bypassed) and the first gate signals transmitted to the first pixel line and the second pixel line are all the high state of the first voltage VGH.

The first sub-driver 101_1 includes the boosting switch T10 and the capacitor C1. The capacitor C1 maintains the voltage difference between the gate electrode and the drain electrode of the boosting switch T10 during a set period (such as a predetermined period) such that the first sub-driver 101_1 may stably generate the first gate signal Gl[1]. The boosting switch T10 is turned on in response to the first common signal supplied to the node Q1, and generates the voltage value corresponding to the pulse voltage of the first sub-clock signal CLK_S1 as the first gate signal Gl[1] transmitted to the first pixel line.

In addition, the second sub-driver 101_2 includes the boosting switch T11 and the capacitor C2. The capacitor C2 maintains the voltage difference between the gate electrode and the source electrode of the boosting switch T11 during a set period (for example, a predetermined period) such that the second sub-driver 101_2 may stably generate the first gate signal Gl[2]. The boosting switch T11 is turned on in response to the first common signal supplied to the node Q1, and generates the voltage value corresponding to the pulse voltage of the second sub-clock signal CLK_S2 as the first gate signal Gl[2] transmitted to the second pixel line.

Accordingly, as shown through the circuit diagram of FIG. 4, the first gate signals output to two pixel lines may be commonly output in response to the first common signal of the node Q1 and the initialization signals of the node N1 of the first driver 100_1 such that the number of circuit elements and the space thereof may be reduced. Further, the first common signal of the node Q1 is transmitted to the second driver 200_1 of the same first stage.

The second driver 200_1 of the first stage includes the switches T12 to T18 and the capacitor CAPA. In addition, the third sub-driver 201_1 and the fourth sub-driver 201_2 coupled to the second driver each include at least one boosting switch and a capacitor. The switches T12 to T18 and capacitor CAPA of the second driver 200_1 have a similar structure and operation as the corresponding switches T3 to T9 and capacitor CAP of the first driver 100_1 such that description of their driving process is not repeated.

However, the second driver 200_1 is driven by receiving the first common signal supplied to the node Q1 as an input signal. In addition, the switch T12 is turned on/off in response to the input second clock signal CLK2 and the switch T18 is turned on/off in response to the input second initialization signal INT2. Further, the second driver 200_1 and second sub-region 201 generate the second gate signals GW[1] and GW[2] respectively transmitted to the first pixel line and the second pixel line, and the switch T16 and the switch T17 transmit the first voltage VGH in response to the node N2, such that the second gate signals GW[1] and GW[2] of the high level VGH are output.

In addition, in response to the second common signal supplied to the node Q2, the third sub-driver 201_1 and the fourth sub-driver 201_2 may respectively output the second gate signals GW[1] and GW[2] of the low level. That is, in response to the second common signal supplied to the node Q2, the boosting switch T19 of the third sub-driver 201_1 is turned on, thereby outputting the second gate signal GW[1] transmitted to the first pixel line according to the input second sub-clock signal CLK_S2 as the low level. Further, in response to the second common signal supplied to the node Q2, the boosting switch T20 of the fourth sub-driver 201_2 is turned on, thereby outputting the second gate signal GW[2] transmitted to the second pixel line according to the input first sub-clock signal CLK_S1 as the low level.

The circuit and the driving of the second stage circuit is similar to the described first stage. That is, the switches T1 to T20 of the first stage have a similar configuration to the corresponding switches A1 and A20 of the second stage such that they are driven by a similar method, and the capacitors CAP, C1, C2, CAPA, C10, and C20 of the first stage are similar to the corresponding capacitors CAP_1, C3, C4, CAPA_1, C30, and C40 of the second stage such that they are driven by a similar method. However, the second common signal of the node Q2 of the second driver 200_1 of the first stage is supplied as an input signal of the third driver 100_2 of the second stage (instead of the driving start signal FLM). The fourth common signal of the node Q4 of the second stage is transmitted as an input signal of the first driver 100_1 of the first stage when driving in the reverse direction.

Extending this concept, each succeeding stage is formed with a structure similar to that of FIG. 4. Thus, each stage includes drivers, each of which is commonly coupled to at least two respective sub-drivers such that dead space reduction may be obtained and complicated circuitry may be simplified.

Figure 5:
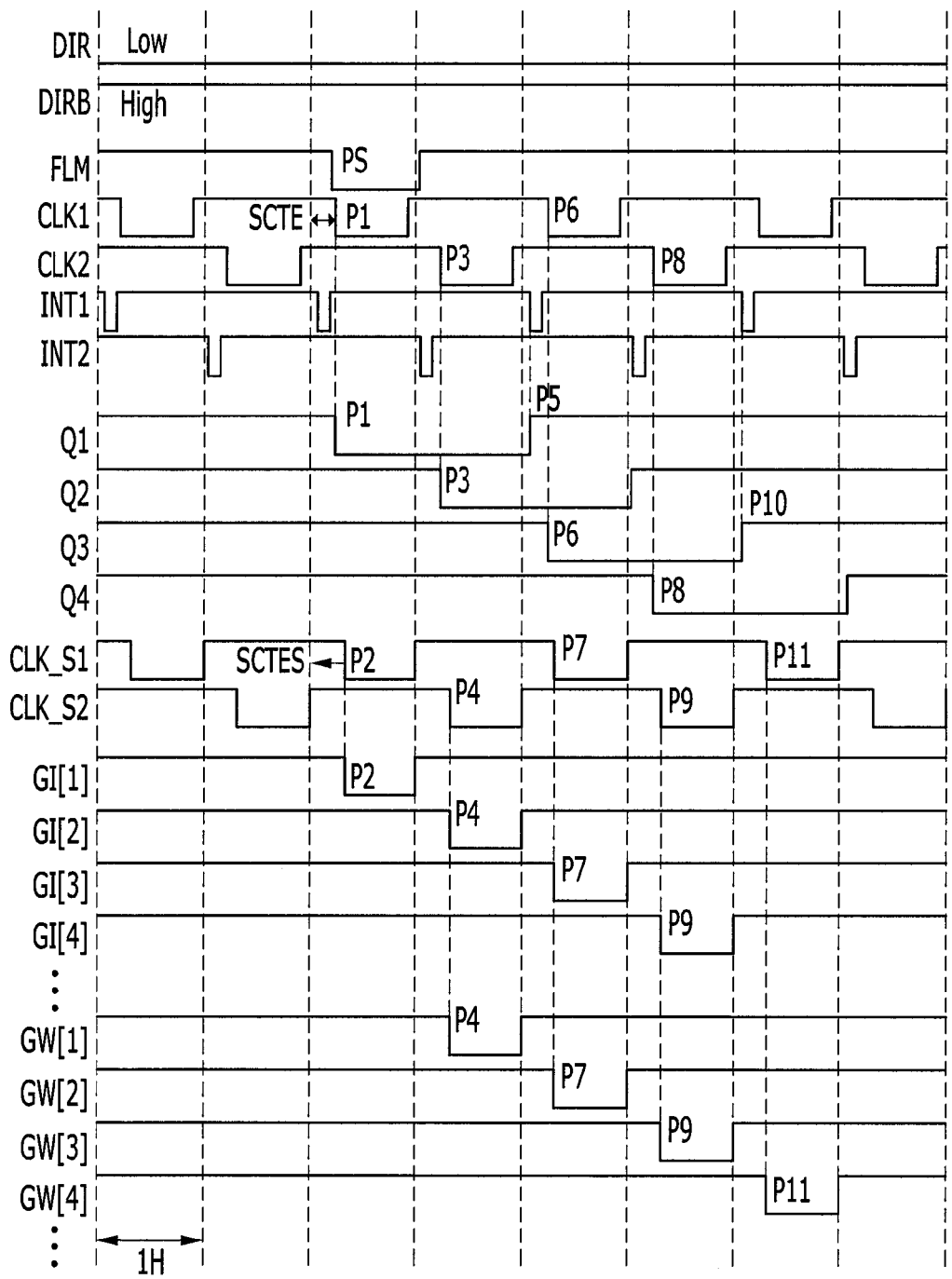
FIG. 5 is a signal timing diagram of a driving of the scan driver of FIG. 4 according to an exemplary embodiment of the present invention.

FIG. 5 is a signal timing diagram of a driving of the scan driver 20 of FIG. 4 according to an exemplary embodiment of the present invention. FIG. 5 will be described by referring to the circuit structure of the scan driver 20 of FIG. 4.

In the exemplary embodiment of FIG. 5, the input signals are input to the circuit of each stage of the data driver 30 illustrated in FIGS. 3-4. It should be noted that the period of each of the first clock signal CLK1 and the second clock signal CLK2 is two horizontal periods 2H (where one horizontal period 1H corresponds to the time to scan one pixel line during scan driving) and these signals are driven as pulse signals with a phase difference of one horizontal period 1H with respect to each other. In addition, the first initialization signal INT1 and the second initialization signal INT2 are each driven with a period of two horizontal periods 2H and a phase difference of one horizontal period 1H with respect to each other. Likewise, the first sub-clock signal CLK_S1 and the second sub-clock signal CLK_S2 are each driven with a period of two horizontal periods 2H and a phase difference of one horizontal period 1H with respect to each other.

FIG. 5 is a timing diagram showing an example of supplying input signals to and generating output signals from the scan driver 20 of FIG. 4 in the forward direction. In the exemplary embodiment of FIG. 5, a driving direction control signal, such as the forward direction driving control signal DIR, is fixed as a DC voltage of the low state. In contrast, another driving direction control signal, such as the reverse direction driving control signal DIRB, has a voltage value that is reversed (for example, opposite polarity) with respect to the forward direction driving control signal DIR such that the reverse direction driving control signal DIRB is fixed as a DC voltage of the high state. In another exemplary embodiment in which the scan driver is driven in the reverse direction is provided, the voltage levels of the DC voltages of the forward direction driving control signal DIR and the reverse direction driving control signal DIRB are reversed. That is, the forward direction driving control signal DIR is supplied as a DC voltage of the high level, and the reverse direction driving control signal DIRB is supplied as a DC voltage of the low level.

The exemplary embodiment of FIG. 5 relates to the forward direction driving such that the driving start signal FLM is the forward direction driving start signal FLM_DN (described above) and is input to the first driver 100_1 of the scan driver 20 of FIG. 4 at time PS as a pulse voltage of a low level. At time PS, the forward direction driving control signal DIR is fixed as a low level voltage such that the switch T1 is turned on and the low level voltage of the driving start signal FLM is transmitted to the switch T4. When the first clock signal CLK1 is decreased to the low level at time P1 by an interval of a set time (such as a predetermined time), the switch T3 is turned on and the low level voltage of the driving start signal FLM is transmitted to the node Q1 as the first common signal. In addition, the first voltage VGH of the high potential is transmitted to the node N1 by the turned-on switch T4, and thereby the switches T5, T6, T7, and T8 are turned off.

Referring to FIG. 5, the voltage of the node Q1 supplying the first common signal is changed to the low level at time P1. Accordingly, the boosting switch T10 forming the first sub-driver 101_1 of FIG. 4 is turned on. Therefore, the output signal of the first sub-driver 101_1, that is, the first gate signal Gl[1], is transmitted to the first pixel line according to the state of the pulse voltage of the first sub-clock signal CLK_S1 transmitted to the source electrode of the switch T10. The pulse voltage of the first sub-clock signal CLK_S1 is decreased to the low level at time P2 such that the first gate signal Gl[1] is output as the pulse voltage of the low level at time P2. The capacitor C1 maintains the turn-on of the switch T10 such that the first gate signal Gl[1] is stably output.

Referring to the timing diagram of FIG. 5, the period of the first clock signal CLK1 and the first sub-clock signal CLK_S1 are the same (namely, two horizontal periods 2H), however there is a small (less than one horizontal period 1H) phase difference between the two signals. That is, in the same horizontal period 1H, a section SCTE (representing the time between the end of the second sub-clock signal CLK_S2 and the start of the first clock signal CLK1) should be smaller than the section SCTES (representing the time between the end of the second sub-clock signal CLK_S2 and the start of the first sub-clock signal CLK_S1) for stable operation. Thus, by controlling the time P2 in which the pulse voltage of the first sub-clock signal CLK_S1 is decreased to the low level to be later than time P1 in which the pulse voltage of the first clock signal CLK1 is decreased to the low level, the first driver 100_1 of the scan driver 20 and the first and second sub-drivers 101_1 and 101_2 coupled thereto are stably driven thereby generating the first gate signals Gl[1] and Gl[2].

To this end, the low level voltage of the node Q1 supplying the first common signal concurrently turns on the boosting switch T11 forming the second sub-driver 101_2 of FIG. 4 along with the boosting switch T10. Therefore, the output signal of the second sub-driver 101_2, that is, the first gate signal Gl[2], is transmitted to the second pixel line according to the state of the pulse voltage of the second sub-clock signal CLK_S2 transmitted to the source electrode of the switch T11. The pulse voltage of the second sub-clock signal CLK_S2 is the high level during a period in which the pulse voltage of the first sub-clock signal CLK_S1 is maintained in the low state such that the first gate signal Gl[2] transmitted to the second pixel line is output as a pulse voltage of the high level. When the second sub-clock signal CLK_S2 is decreased to the low level at time P4, the pulse voltage of the first gate signal Gl[2] transmitted to the second pixel line is output as the low level at time P4. The capacitor C2 maintains the turn-on state of the switch T11 such that the first gate signal Gl[2] may be stably output.

Further, in the first driver 100_1, the first common signal of the common node Q1 to which the sub-drivers 101_1 and 101_2 are commonly coupled is also input to the second driver 200_1. The first common signal of the node Q1 is the low level such that the switch T13 having the gate electrode supplied with this voltage is turned on, and accordingly the first voltage VGH of the high potential is transmitted to the node N2. Thus, the switches T14, T15, T16, and T17 are turned off. During this period, the second clock signal CLK2 drops to the low level at time P3 and is supplied to the switch T12 to turn on the switch T12. The low level voltage value of the first common signal of the node Q1 is then transmitted to the node Q2. Accordingly, as shown in FIG. 5, the second common signal of the node Q2 is changed to the low level at time P3.

The low level voltage of the second common signal of the node Q2 concurrently turns on the boosting switch T19 of the third sub-driver 201_1 and the boosting switch T20 of the fourth sub-driver 201_2 that are commonly coupled to the node Q2. The second sub-clock signal CLK_S2 is supplied to the source electrode of the boosting switch T19 such that the boosting switch T19 outputs the second gate signal GW[1] transmitted to the first pixel line according to the pulse voltage of the second sub-clock signal CLK_S2. Accordingly, when the pulse voltage of the second sub-clock signal CLK_S2 drops to the low state at time P4, the second gate signal GW[1] is transmitted to the first pixel line as a pulse voltage of the low level.

In addition, the first sub-clock signal CLK_S1 is supplied to the source electrode of the boosting switch T20 such that the boosting switch T20 outputs the second gate signal GW[2] transmitted to the second pixel line according to the pulse voltage of the first sub-clock signal CLK_S1. Accordingly, while the second gate signal GW[1] transmitted from the second sub-clock signal CLK_S2 to the first pixel line is maintained as the low level, the pulse voltage of the first sub-clock signal CLK_S1 is maintained as the high level and thus, the second gate signal GW[2] transmitted to the second pixel line is output as the high level. Then, at time P7, the second gate signal GW[2] is output as the pulse voltage of the low level according to the first sub-clock signal CLK_S1.

Meanwhile, when the first initialization signal INT1 is decreased to the low level at time P5, the switch T9 of the first driver is turned on and the second voltage VGL of the low potential is transmitted to the node N1. The voltage of the node N1 is the low state such that the switches T5, T6, T7, and T8 coupled to the node N1 are turned on. The turned-on switches T5 and T6 transmit the first voltage VGH of the high potential to the node Q1 such that the first common signal of the node Q1 is increased to the high level at time P5. Accordingly, the boosting switches T10 and T11 of the first sub-driver 101_1 and the second sub-driver 101_2 are turned off. In addition, the high level voltage of the first voltage VGH is output as the first gate signal Gl[1] transmitted to the first pixel line by the turned on switch T7, and as the first gate signal Gl[2] transmitted to the second pixel line by the turned on switch T8.

Meanwhile, the second common signal of the low level supplied to the node Q2 is input to the third driver 100_2 of the next stage (the second stage) of the scan driver 20. Further, the fourth common signal supplied to the node Q4 is transmitted as a first stage input signal to the first driver 100_1. It should be noted that the reverse direction driving control signal DIRB is fixed at the high level such that the fourth common signal of the node Q4 input to the first driver 100_1 of the first stage is not related to the circuit driving in the forward direction driving.

The voltage value of the low level of the second common signal of the node Q2 input to the third driver 100_2 of the second stage is transmitted to the node Q3 through the switch A3 when the first clock signal CLK1 is again supplied as the low level at time P6. The second stage driving is similar to the described first stage driving above such that the description thereof will not be repeated.

The fifth sub-driver 102_1 and the sixth sub-driver 102_2 that are commonly coupled to the node Q3 respectively output the first gate signal Gl[3] coupled to the third pixel line and the first gate signal Gl[4] coupled to the fourth pixel line by the boosting switch A10 and the boosting switch A11. That is, the fifth sub-driver 102_1 outputs the first gate signal Gl[3] coupled to the third pixel line having the pulse voltage of the low level at time P7 according to the first sub-clock signal CLK_S1 by the boosting switch A10. In addition, the sixth sub-driver 102_2 outputs the first gate signal Gl[4] coupled to the fourth pixel line having the pulse voltage of the low level at time P9 according to the second sub-clock signal CLK_S2 by the boosting switch A11.

The voltage value of the low level of the third common signal of the node Q3 is input to the fourth driver 200_2 of the second stage and the fourth driver 200_2 is operated similar to the first stage circuit driving as described above. When the second clock signal CLK2 is again decreased a time P8, the voltage of the node Q3 is transmitted to the node Q4 through the switch A12, the seventh sub-driver 202_1 and the eighth sub-driver 202_2 that are commonly coupled to the fourth common signal of the node Q4 respectively output the second gate signal GW[3] coupled to the third pixel line and the second gate signal GW[4] coupled to the fourth pixel line by the boosting switch A19 and the boosting switch A20.

Therefore, the seventh sub-driver 202_1 outputs the second gate signal GW[3] coupled to the third pixel line having the pulse voltage of the low level at time P9 according to the second sub-clock signal CLK_S2 by the boosting switch A19. In addition, the eighth sub-driver 202_2 outputs the second gate signal GW[4] coupled to the fourth pixel line having the pulse voltage of the low level at time P11 according to the first sub-clock signal CLK_S1 by the boosting switch A20.

Further, the first initialization signal INT1 is again decreased to the low level at time P10 such that the pulse voltage of two first gate signals Gl[3] and Gl[4] output from the second stage are maintained at the high level state. Likewise, when the second initialization signal INT2 is again decreased to the low level, two recent second gate signals GW[3] and GW[4] output in each stage are maintained as pulse voltages of the high level.

The scan driver 20 according to an exemplary embodiment of the present invention according to the timing diagram of FIG. 5 outputs the second gate signal GW[1] transmitted to the first pixel line shortly after (for example, within one horizontal period) the time that the driving start signal FLM is increased from the low level to the high level. The pixels 60 included in the first pixel line of the display unit 10 receive the second gate signal GW[1] to read and store the data voltage according to the corresponding image data signal of the current frame thereby displaying the image according thereto. Accordingly, compared with the scan signal being generated after a long time (for example, several horizontal periods) has passed after the input of the driving start signal (such as with a conventional scan driver), the signal output of the scan driver 20 according to an exemplary embodiment is fast and stable.

Figure 6:
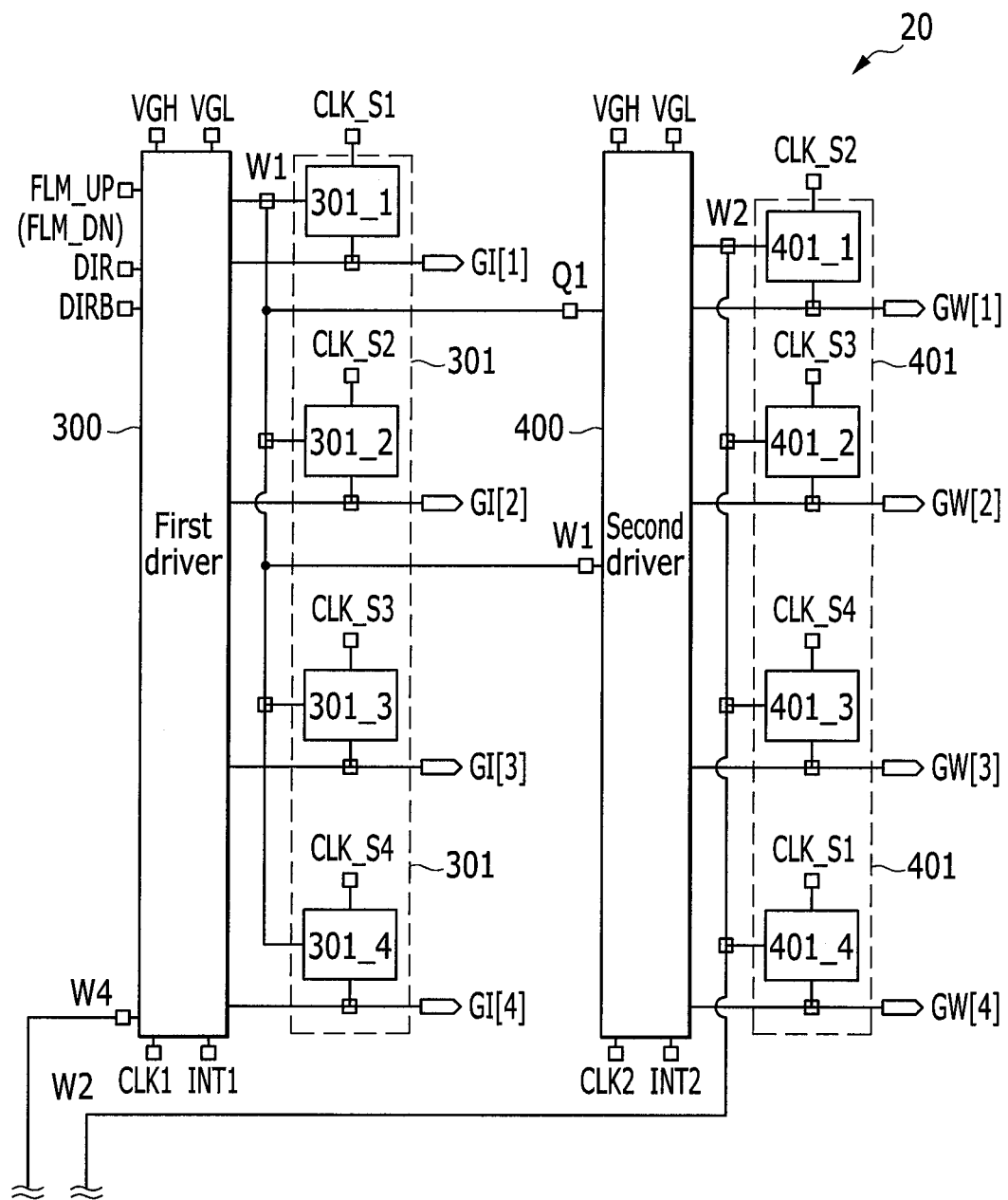
FIG. 6 is a block diagram showing a scan driver included in the display device shown in FIG. 1 according to another exemplary embodiment of the present invention.

FIG. 6 is a block diagram showing a scan driver 20 included in the display device shown in FIG. 1 according to another exemplary embodiment of the present invention.

The structure of the scan driver 20 of FIG. 6 is related to a portion of the scan driver 20 coupled to the first gate lines Gl1 and Gl4 and the second gate lines GW1 to GW4 respectively coupled to the first pixel line through the fourth pixel line among the pixel lines of the display unit 10 as in the scan driver 20 of FIG. 3. The scan driver 20 of FIG. 6 includes drivers 300 and 400 respectively supplying first and second common signals to sub-regions 301 and 401 via nodes W1 and W2. Unlike the exemplary embodiment of FIG. 3, in each of the sub-regions 301 and 401 of the scan driver 20, four sub-drivers generate and transmit the output signals to four corresponding first or second gate lines.

The scan driver 20 of FIG. 6 includes the first driver 300 and the second driver 400 for respectively generating and supplying the first and second common signals to each of the sub-drivers in the corresponding first and second sub-regions 301 and 401. The first driver 300 is coupled to the first sub-region 301 to supply the first common signal. The first sub-region 301 includes four sub-drivers, namely the first sub-driver 301_1, the second sub-driver 301_2, the third sub-driver 301_3, and the fourth sub-driver 301_4, which are commonly coupled to the node W1 of the first driver 300 to receive the first common signal for the driving. The first sub-driver 301_1, the second sub-driver 301_2, the third sub-driver 301_3, and the fourth sub-driver 301_4 generate and transmit the first gate signals Gl[1] to Gl[4]) respectively corresponding to four first gate lines Gl1 to Gl4 coupled to the first pixel line through the fourth pixel line of the display unit 10.

In addition, the second driver 400 for supplying the second common signal is coupled to the second sub-region 401 to supply the second common signal. The second sub-region 401 includes four sub-drivers, namely the fifth sub-driver 401_1, the sixth sub-driver 401_2, the seventh sub-driver 401_3, and the eighth sub-driver 401_4, which are commonly coupled to the node W2 of the second driver 400 to receive the second common signal for the driving. The fifth sub-driver 401_1, the sixth sub-driver 401_2, the seventh sub-driver 401_3, and the eighth sub-driver 401_4 generate and transmit the second gate signals GW[1] to GW[4] respectively corresponding to four second gate lines GW1 to GW4 coupled to the first pixel line through the fourth pixel line of the display unit 10.

Referring to FIG. 6, the voltage of the second common signal of the node W2 of the second driver 400 is input to the initial driver of the next stage, and the first gate signals and the second gate signals are sequentially generated and transmitted to the pixel lines through the driving of the stages that are repeatedly provided. In addition, the voltage of the last driver of the second stage is again input to the first driver 300 of the first stage of FIG. 6 during reverse direction driving.

The input signals and the constitution of the first driver 300 and the second driver 400 of FIG. 6 similar to the drivers of FIG. 3 such that their detailed description is not repeated. In addition, the first to eighth sub-drivers 301_1 to 401_4 of FIG. 6 also correspond to the sub-drivers of FIG. 3. However, in FIG. 6, four sub-drivers are coupled to one node supplying a common signal such that the driving according to the voltage of the common signal of the coupled node is different from the structure of FIG. 3. More particularly, the first to fourth sub-drivers 301_1, 301_2, 301_3, and 301_4 coupled to the node W1 of the first driver 300 respectively receive the voltage value of the first common signal of the node W1 to sequentially generate the first gate signals Gl[1] to Gl[4] according to the first to fourth sub-clock signals CLK_S1, CLK_S2, CLK_S3, and CLK_S4 that are respectively input through the first to fourth sub-drivers' input terminals.

In addition, the voltage value of the first common signal of the node W1 of the first driver 300 is input to the second driver 400 for maintaining the driving process. That is, the fifth to eighth sub-drivers 401_1, 401_2, 401_3, and 401_4 coupled to the node W2 of the second driver 400 respectively receive the voltage value of the second common signal of the node W2 to sequentially generate the second gate signals GW[1] to GW[4] according to the second sub-clock signal CLK_S2, the third sub-clock signal CLK_S3, the fourth sub-clock signal CLK_S4, and the first sub-clock signal CLK_S1 respectively input through the fifth to eighth sub-drivers' input terminals.

Figure 7:
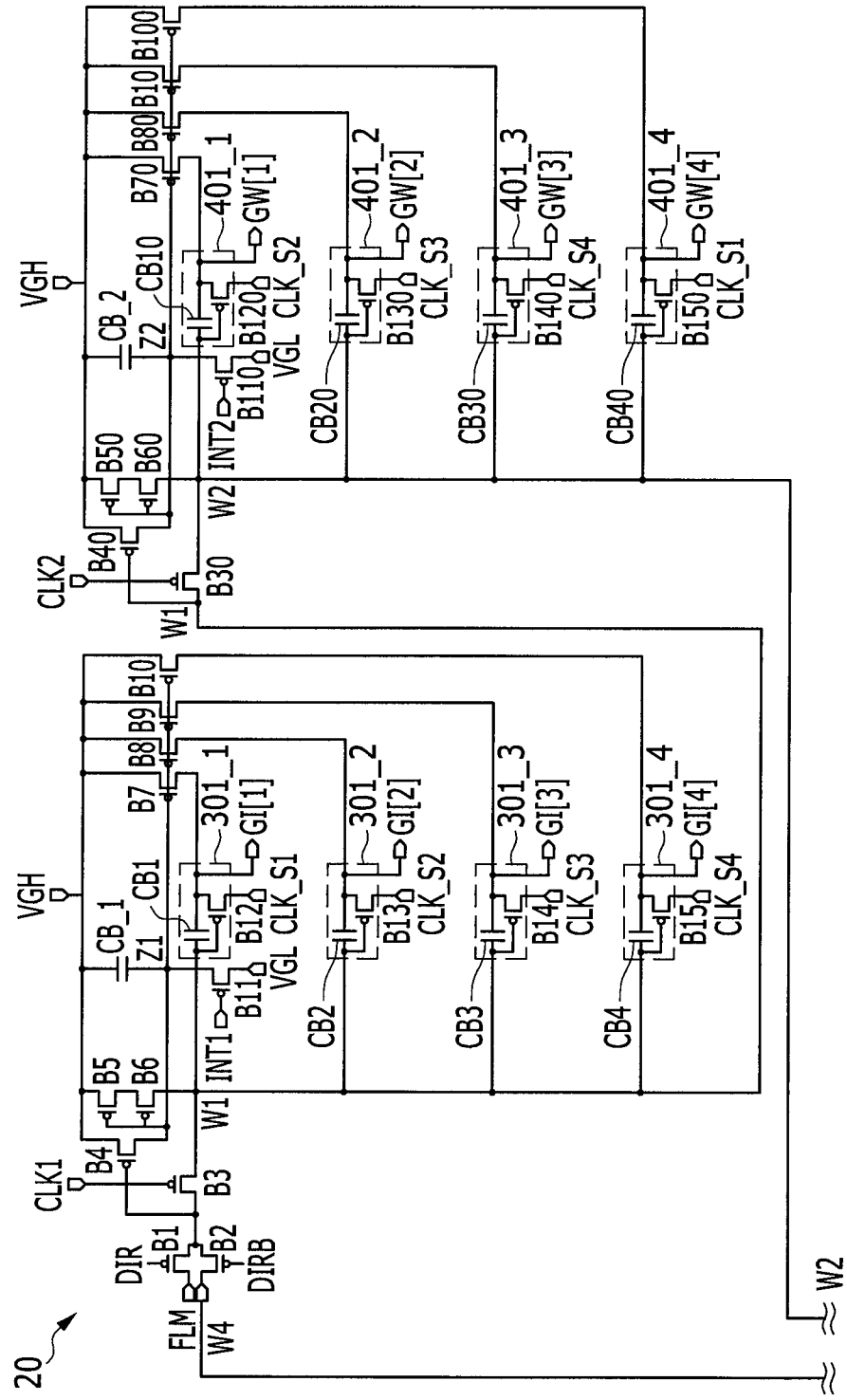
FIG. 7 is a circuit diagram of the scan driver shown in FIG. 6 according to an exemplary embodiment of the present invention.
Figure 8:
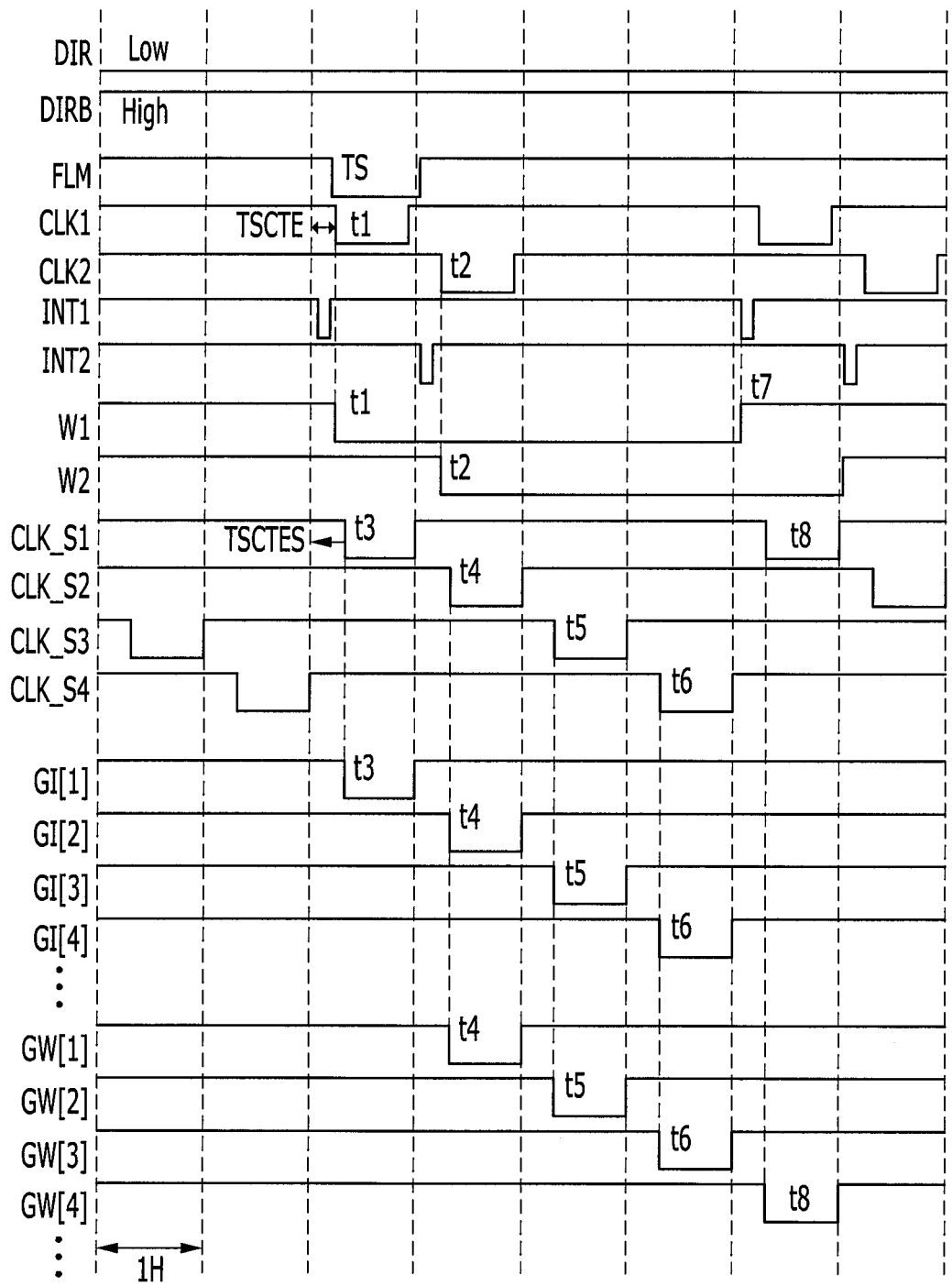
FIG. 8 is a signal timing diagram of a driving of the scan driver of FIG. 7 according to an exemplary embodiment of the present invention.

FIG. 7 is a circuit diagram of the scan driver 20 shown in FIG. 6 according to an exemplary embodiment of the present invention. FIG. 8 is a signal timing diagram of a driving of the scan driver 20 of FIG. 7 according to an exemplary embodiment of the present invention.

The circuit diagram of FIG. 7 shows one stage, that is, one stage with reference to the drivers to which their corresponding sub-drivers are commonly connected, like the block diagram shown in FIG. 6. That is, FIG. 7 represents a one stage circuit diagram generating the output signals to the first to fourth pixel lines of the display unit 10. The scan driver 20 is a structure for which this stage circuit is repeatedly added in the vertical direction according to the number of lines of the pixels 60.

In the scan driver 20 of FIG. 7, the first driver 300 includes a plurality of switches B1 to B11 and is coupled to the first to fourth sub-drivers 301_1, 301_2, 301_3, and 301_4. The second driver 400 is coupled to the first driver 300 and receives the voltage of the first common signal of the node W1 of the first driver 300. The second driver 400 includes a plurality of switches B30, B40, B50, B60, B70, B80, B90, B100, and B110 and is coupled to the fifth to eighth sub-drivers 401_1, 401_2, 401_3, and 401_4.

Referring to FIG. 7, each sub-driver includes at least one boosting switch and a capacitor, and sequentially transmits a corresponding sub-clock signal transmitted through a respective input terminal according to the timing as one of the corresponding gate signals. The first sub-driver 301_1 coupled to the node W1 of the first driver 300 includes the boosting switch B12 and the capacitor CB1, and receives the first sub-clock signal CLK_S1 to output the first gate signal Gl[1] transmitted to the first pixel line. The second sub-driver 301_2 coupled to the node W1 includes the boosting switch B13 and the capacitor CB2, and receives the second sub-clock signal CLK_S2 to output the first gate signal Gl[2] transmitted to the second pixel line. The third sub-driver 3013 includes the boosting switch B14 and the capacitor CB3, and receives the third sub-clock signal CLK_S3 to output the first gate signal Gl[3] transmitted to the third pixel line. The fourth sub-driver 301_4 includes the boosting switch B15 and the capacitor CB4, and receives the fourth sub-clock signal CLK_S4 to output the first gate signal Gl[4] transmitted to the fourth pixel line.

In addition, the fifth sub-driver 401_1 coupled to the node W2 of the second driver 400 includes the boosting switch B120 and the capacitor CB10, and receives the second sub-clock signal CLK_S2 to output the second gate signal GW[1] transmitted to the first pixel line. The sixth sub-driver 401_2 coupled to the node W2 includes the boosting switch B130 and the capacitor CB20, and receives the third sub-clock signal CLK_S3 to output the second gate signal GW[2] transmitted to the second pixel line. The seventh sub-driver 401_3 includes the boosting switch B140 and the capacitor CB30, and receives the fourth sub-clock signal CLK_S4 to output the second gate signal GW[3] transmitted to the third pixel line. The eighth sub-driver 401_4 includes the boosting switch B150 and the capacitor CB40, and receives the first sub-clock signal CLK_S1 to output the second gate signal GW[4] transmitted to the fourth pixel line.

The operation and the function of the switch forming the first driver 300 and the second driver 400 are the drivers described in FIG. 4 such that their detailed description is not repeated. Accordingly, the operation of the scan driver according to the exemplary embodiment of FIG. 7 will be described based on the timing diagram shown in FIG. 8.

In the exemplary embodiment of FIG. 8, the input signals are input to the circuit of each stage of the scan driver 20 illustrated in FIGS. 6-7. It should be noted that the period of each of the first clock signal CLK1 and the second clock signal CLK2 is four horizontal periods 4H and these signals are driven as pulse signals with a phase difference of one horizontal period 1H. In addition, the first initialization signal INT1 and the second initialization signal INT2 are each driven with a period of four horizontal periods 4H and a phase difference of one horizontal period 1H. Likewise, the first sub-clock signal CLK_S1, the second sub-clock signal CLK_S2, the third sub-clock signal CLK_S3, and the fourth sub-clock signal CLK_S4 are each driven with a period of four horizontal periods 4H in sequential fashion with a phase difference of one horizontal period 1H from one sub-clock signal to the next. However, the present invention is not limited thereto.

FIG. 8 is a timing diagram of an example of supplying input signals to generate output signals by driving the scan driver 20 of FIG. 7 in the forward direction. Accordingly, the forward direction driving control signal DIR is fixed as a DC voltage of the low state while the reverse direction driving control signal DIRB is fixed as a DC voltage of the high state. For the forward direction driving, the driving start signal FLM is the forward direction driving start signal FLM_DN, which is input as a pulse voltage of the low level at time TS as an input to the first driver 300 of FIGS. 6-7. Thus, the switch B1 is turned on by the forward direction driving control signal DIR and the low level voltage of the driving start signal FLM is transmitted to the switch B4. The first voltage VGH of the high potential is transmitted to the node Z1 by the turned-on switch B4 such that the switches B5, B6, B7, B8, B9, and B10 are turned off.

When the first clock signal CLK1 is decreased to the low level at time t1, the switch B3 is turned on such that the low level voltage of the driving start signal FLM is transmitted to the node W1. Therefore, the voltage value of the first common signal of the node W1 is changed to the low level at time t1 as shown in FIG. 8. Thus, the boosting switch B12 forming the first sub-driver 301_1 coupled to the node W1 is turned on and the output signal of the first sub-driver 301_1, that is, the first gate signal Gl[1] transmitted to the first pixel line via the first gate line Gl1, is output according to the pulse voltage of the first sub-clock signal CLK_S1 transmitted to the source electrode of the switch B12. The pulse voltage of the first sub-clock signal CLK_S1 is decreased to the low level at time t3 such that the first gate signal Gl[1] is output as the pulse voltage of the low level. The capacitor CB1 maintains the turn-on state of the switch B12 such that the first gate signal Gl[1] is stably output.

Referring to the timing diagram of FIG. 8, the period of the first clock signal CLK1 and the first sub-clock signal CLK_S1 are the same (four horizontal periods 4H), however the number of times that the signals derived from these signals, such as the first common signal (at node W1) and the first gate signal Gl[1], are decreased to the low level voltage may be controlled to be different. Further, in the exemplary driving illustrated in the timing diagram of FIG. 8, there is a small (less than one horizontal period 1H) phase difference between the first clock signal CLK1 and the first sub-clock signal CLK_S1. That is, in the same horizontal period 1H, the section TSCTE (representing the time between the end of the fourth sub-clock signal CLK_S4 and the start of the first clock signal CLK1) should be smaller than the section TSCTES (representing the time between the end of the fourth sub-clock signal CLK_S4 and the start of the first sub-clock signal CLK_S1) for stable operation. Thus, by controlling the time t3 that the pulse voltage of the first sub-clock signal CLK_S1 is decreased to the low level to be later than time t1 that the pulse voltage of the first clock signal CLK1 is decreased to the low level, the scan driver 20 is stably driven to generate the output signals.

The low level voltage of the node W1 supplying the first common signal concurrently turns on the boosting switch B13 forming the second sub-driver 301_2 of FIG. 7, the boosting switch B14 forming the third sub-driver 301_3, and the boosting switch B15 of the fourth sub-driver 301_4 along with the boosting switch B12. Therefore, the first gate signal Gl[2]) is transmitted to the second pixel line according to the pulse voltage of the second sub-clock signal CLK_S2 transmitted to the source electrode of the switch B13. When the second sub-clock signal CLK_S2 is decreased to the low level at time t4, the pulse voltage of the first gate signal Gl[2] is transmitted to the second pixel line as the low level.

Likewise, the first gate signal Gl[3] is transmitted to the third pixel line according to the pulse voltage state of the third sub-clock signal CLK_S3 transmitted to the source electrode of the switch B14. When the third sub-clock signal CLK_S3 is decreased to the low level at time t5, the pulse voltage of the first gate signal Gl[3] is transmitted to the third pixel line as the low level. In addition, the first gate signal Gl[4] is transmitted to the fourth pixel line according to the pulse voltage state of the fourth sub-clock signal CLK_S4 transmitted to the source electrode of the switch B15. When the fourth sub-clock signal CLK_S4 is decreased to the low level at time t6, the pulse voltage of the first gate signal Gl[4] is transmitted to the fourth pixel line as the low level. The capacitors CB2, CB3, and CB4 respectively maintain the turn-on state of the boosting switches B13, B14, and B15 such that the first gate signals Gl[2], Gl[3], and Gl[4] are stably output.

Further, in the first driver 300, the voltage value of the first common signal of node W1 to which the sub-drivers 301_1, 301_2, 301_3, 301_4 are commonly coupled is input to the second driver 400. The voltage of the first common signal of the node W1 is the low level such that the switch B40 receiving the voltage through the gate electrode is turned on to transmit the first voltage VGH of the high potential to the node Z2. Thus, the switches B50, B60, B70, B80, B90, and B100 are turned off.

The second clock signal CLK2 drops to the low level at time t2 to turn on the switch B30. The low level voltage value of the node W1 is transmitted to the node W2. Accordingly, as shown in FIG. 8, the voltage of the node W2 is changed to the low level at time t2. The low level voltage of the second common signal of the node W2 concurrently turns on the boosting switch B120 of the fifth sub-driver 401_1, the boosting switch B130 of the sixth sub-driver 401_2, the boosting switch B140 of the seventh sub-driver 401_3, and the boosting switch B150 of the eighth sub-driver 401_4 that are commonly coupled to the node W2.

The second gate signal GW[1] is transmitted to the first pixel line according to the pulse voltage of the second sub-clock signal CLK_S2 transmitted to the source electrode of the boosting switch B120 of the fifth sub-driver 401_1. When the second sub-clock signal CLK_S2 drops to the low level at time t4, the pulse voltage of the second gate signal GW[1] is transmitted to the first pixel line as the low level. The second gate signal GW[2] is transmitted to the second pixel line according to the pulse voltage of the third sub-clock signal CLK_S3 transmitted to the source electrode of the boosting switch B130 of the sixth sub-driver 401_2. When the third sub-clock signal CLK_S3 is decreased to the low level at time t5, the pulse voltage of the second gate signal GW[2] is transmitted to the second pixel line as the low level.

Likewise, the second gate signal GW[3] is transmitted to the third pixel line according to the pulse voltage of the fourth sub-clock signal CLK_S4 transmitted to the source electrode of the boosting switch B140 of the seventh sub-driver 4013. When the fourth sub-clock signal CLK_S4 is decreased to the low level at time t6, the pulse voltage of the second gate signal GW[3] is transmitted to the third pixel line as the low level. The second gate signal GW[4] is transmitted to the fourth pixel line according to the pulse voltage of the first sub-clock signal CLK_S1 transmitted to the source electrode of the boosting switch B150 of the eighth sub-driver 401_4. When the first sub-clock signal CLK_S1 is decreased to the low level at time t8, the pulse voltage of the second gate signal GW[4] is transmitted to the fourth pixel line as the low level. The capacitors CB10, CB20, CB30, and CB40 respectively maintain the turn-on state of the boosting switches B120, B130, B140, and B150 such that the second gate signals GW[1], GW[2], GW[3], and GW[4] are stably output.

When the first initialization signal INT1 drops to the low level at time t7 after the first clock signal CLK1 is supplied as the pulse voltage of the low level, the switch B11 of the first driver is turned on and the second voltage VGL of the low potential is transmitted to the node Z1. The voltage of the node Z1 is the low state such that the switches B5, B6, B7, B8, B9, and B10 coupled to the node Z1 are turned on. The turned-on switches B5 and B6 transmit the first voltage VGH of the high potential to the node W1 such that the voltage of the first common signal of the node W1 is increased to the high level at time t7. Accordingly, the boosting switches B12, B13, B14, and B15 of the first sub-driver 301_1 to the fourth sub-driver 301_4 are turned off. In addition, the high level voltage of the first voltage VGH is output as the first gate signal Gl[1] transmitted to the first pixel line by the turned-on switch B7. More generally, the pulse voltage of the first gate signals Gl[1] to Gl[4] that are respectively output from the first sub-driver 301_1 to the fourth sub-driver 301_4 are transmitted as the high level by the turned-on switches B7, B8, B9, and B10.

In addition, when the second initialization signal INT2 is decreased to the low level after time t7, the second driver 400 and the fifth sub-driver 401_1 to the eighth sub-driver 401_4 that are commonly coupled thereto are driven as described above with respect to the first driver 300 and the first sub-driver 301_1 to the fourth sub-driver 301_4. Accordingly, the voltage of the second common signal of the node W2 is increased to the high level, and the boosting switches B120, B130, B140, and B150 of the fifth sub-driver 401_1 to the eighth sub-driver 401_4 are turned off. In addition, the pulse voltage of the second gate signals GW[1] to GW[4] respectively output in the fifth sub-driver 401_1 to the eighth sub-driver 401_4 are transmitted as the high level state by the turned-on switches B70, B80, B90, and B100.

The drawings referred to hereinabove and the detailed description of exemplary embodiments of the disclosed invention are presented for illustrative purposes only, and are not intended to define meanings or limit the scope of the present invention as set forth in the following claims and their equivalents. Therefore, it will be appreciated to those skilled in the art that various modifications may be made and other equivalent embodiments are available. Those skilled in the art can omit some of the constituent elements described in the present specification without deterioration in performance thereof or can add constituent elements to improve performance thereof. Further, those skilled in the art can modify the sequence of the steps of the method described in the present specification depending on the process environment or equipment. Therefore, the range of the present invention must be determined by the scope of the claims and their equivalents, not by the described exemplary embodiments.

<Description of Some Symbols>

| | |
|---|---|
| 10: display unit | 20: scan driver |
| 30: data driver | 40: light emission control driver |
| 50: controller | 60: pixel |

What is claimed is:

1. A scan driver configured to drive a plurality of pixels with a plurality of gate signals, the gate signals comprising a plurality of first gate signals for transmitting to a plurality of first gate lines and a plurality of second gate signals for transmitting to a plurality of second gate lines, the scan driver comprising:
a plurality of stages, each of the stages comprising one or more regions including a first region and a second region, each of the regions comprising:
a plurality of sub-drivers configured to generate ones of the gate signals and to transmit the ones of the gate signals to ones of the pixels; and
a driver commonly coupled to the sub-drivers and configured to concurrently supply a common signal to each of the sub-drivers, the driver of one of the one or more regions being configured to receive the common signal of one of the one or more regions of a previous one of the stages during forward direction driving or of a next one of the stages during reverse direction driving,
wherein the first region comprises a plurality of first sub-drivers configured to generate ones of the first gate signals and to transmit the ones of the first gate signals to the ones of the pixels via ones of the first gate lines, and
wherein the second region comprises a plurality of second sub-drivers configured to generate ones of the second gate signals and to transmit the ones of the second gate signals to the ones of the pixels via ones of the second gate lines.

2. The scan driver of claim 1, wherein
the pixels are arranged in a plurality of pixel lines coupled to the first gate lines and to the second gate lines,
the first region comprises a first driver commonly coupled to the plurality of first sub-drivers configured to transmit the ones of the first gate signals to the ones of the first gate lines coupled to ones of the pixel lines, and
the second region comprises a second driver commonly coupled to the plurality of second sub-drivers configured to transmit the ones of the second gate signals to the ones of the second gate lines coupled to the ones of the pixel lines.

3. The scan driver of claim 2, wherein
the first driver is configured to concurrently supply a first common signal to each of the first sub-drivers,
the second driver is configured to concurrently supply a second common signal to each of the second sub-drivers,
the first sub-drivers comprise:
a first sub-driver configured to generate and transmit a first of the first gate signals to a first of the first gate lines coupled to a first pixel line of the pixel lines; and
a second sub-driver configured to generate and transmit a second of the first gate signals to a second of the first gate lines coupled to a second pixel line of the pixel lines that is adjacent to the first pixel line, and
the second sub-drivers comprise:
a third sub-driver configured to generate and transmit a first of the second gate signals to a first of the second gate lines coupled to the first pixel line; and
a fourth sub-driver configured to generate and transmit a second of the second gate signals to a second of the second gate lines coupled to the second pixel line.

4. The scan driver of claim 3, wherein each of the sub-drivers comprises:
a boosting transistor configured to generate one of the gate signals; and
a capacitor comprising two terminals coupled between a gate and a source of the boosting transistor, the capacitor being configured to maintain a potential difference between the two terminals.

5. The scan driver of claim 3, wherein
the first driver is configured to receive a driving start signal, a driving direction control signal, a first clock signal, and a first initialization signal, and
the second driver is configured to receive the first common signal, a second clock signal, and a second initialization signal.

6. The scan driver of claim 5, wherein the driving start signal
is a forward direction driving start signal for the first driver of a first stage of the stages during the forward direction driving, and
is a reverse direction driving start signal for the first driver of a final stage of the stages during the reverse direction driving.

7. The scan driver of claim 5, wherein
the driving direction control signal comprises a forward direction driving control signal and a reverse direction driving control signal, and
the forward direction driving control signal and the reverse direction driving control signal are configured to be received by the first driver as fixed voltages having reversed polarities.

8. The scan driver of claim 3, wherein
the first sub-driver is further configured to receive a first sub-clock signal and to transmit the first of the first gate signals according to the first sub-clock signal,
the second sub-driver is further configured to receive a second sub-clock signal and to transmit the second of the first gate signals according to the second sub-clock signal,
the third sub-driver is further configured to receive the second sub-clock signal and to transmit the first of the second gate signals according to the second sub-clock signal, and
the fourth sub-driver is further configured to receive the first sub-clock signal and to transmit the second of the second gate signals according to the first sub-clock signal.

9. The scan driver of claim 8, wherein
each of the first sub-clock signal and the second sub-clock signal is driven with a period of two horizontal periods, and
the second sub-clock signal has a phase difference of one horizontal period with respect to the first sub-clock signal.

10. The scan driver of claim 8, wherein
the first driver is configured to receive a first clock signal,
the second driver is configured to receive a second clock signal,
the first sub-driver and the second sub-driver are further configured to respectively sequentially output the first of the first gate signals and the second of the first gate signals after the first driver receives the first clock signal, and
the third sub-driver and the fourth sub-driver are further configured to respectively sequentially output the first of the second gate signals and the second of the second gate signals after the second driver receives the second clock signal.

11. The scan driver of claim 3, wherein
the first driver of a first stage of the stages and the first driver of a final stage of the stages are configured to receive a driving start signal, and
the third sub-driver of one of the first stage or the final stage is configured to transmit the first of the second gate signals of the one of the first stage or the final stage within one horizontal period after the first driver of the one of the first stage or the final stage has finished receiving the driving start signal.

12. The scan driver of claim 3, wherein
the first driver is configured to
receive a first initialization signal and
change a voltage value of the first common signal according to the received first initialization signal to stop an operation of the first sub-driver and the second sub-driver, and
the second driver is configured to
receive a second initialization signal and
change a voltage value of the second common signal according to the received second initialization signal to stop the operation of the third sub-driver and the fourth sub-driver.

13. The scan driver of claim 3, wherein the first driver in a first stage of the stages comprises:
a first switch configured to turn on according to a forward direction driving control signal to transmit a pulse voltage of a forward direction driving start signal;
a second switch configured to turn on according to a reverse direction driving control signal to transmit the second common signal of a second stage of the stages;
a third switch configured to turn on according to a first clock signal to transmit one of the pulse voltage of the forward direction driving start signal or the second common signal of the second stage as the first common signal;
a fourth switch configured to turn on according to the one of the pulse voltage of the forward direction driving start signal or the second common signal of the second stage to transmit a first voltage of a high level to a first node;
a fifth switch and a sixth switch configured to turn on according to a voltage value of the first node to transmit the first voltage as the first common signal;
a capacitor coupled to the first node and to a supply source of the first voltage;
a seventh switch configured to turn on according to the voltage value of the first node to transmit the first voltage as the first of the first gate signals to the first of the first gate lines coupled to the first pixel line;
an eighth switch configured to turn on according to the voltage value of the first node to transmit the first voltage as the second of the first gate signals to the second of the first gate lines coupled to the second pixel line; and
a ninth switch configured to turn on according to a first initialization signal to transmit a second voltage of a low level to the first node.

14. The scan driver of claim 3, wherein the second driver in a first stage of the stages comprises:
a first switch configured to turn on according to a second clock signal to transmit the first common signal as the second common signal;
a second switch configured to turn on according to the first common signal to transmit a first voltage of a high level to a first node;
a third switch and a fourth switch configured to turn on according to a voltage value of the first node to transmit the first voltage as the second common signal:
a fifth switch configured to turn on according to the voltage value of the first node to transmit the first voltage as the first of the second gate signals to the first of the second gate lines coupled to the first pixel line,
a sixth switch configured to turn on according to the voltage value of the first node to transmit the first voltage as the second of the second gate signals to the second of the second gate lines coupled to the second pixel line; and
a seventh switch configured to turn on according to a second initialization signal to transmit a second voltage of a low level to the first node.

15. The scan driver of claim 2, wherein
the first gate signals are configured to initialize the pixels by resetting data voltages stored in the pixels according to image data signals transmitted to the pixels during a previous frame, and
the second gate signals are configured to compensate threshold voltages of driving transistors of the pixels and to store data voltages in the pixels according to image data signals transmitted to the pixels during a current frame.

16. The scan driver of claim 2, wherein
the first driver is configured to concurrently supply a first common signal to each of the first sub-drivers,
the second driver is configured to concurrently supply a second common signal to each of the second sub-drivers,
the first sub-drivers comprise:
a first sub-driver configured to generate and transmit a first of the first gate signals to a first of the first gate lines coupled to a first pixel line of the pixel lines;
a second sub-driver configured to generate and transmit a second of the first gate signals to a second of the first gate lines coupled to a second pixel line of the pixel lines that is adjacent to the first pixel line;
a third sub-driver configured to generate and transmit a third of the first gate signals to a third of the first gate lines coupled to a third pixel line of the pixel lines that is adjacent to the second pixel line; and
a fourth sub-driver configured to generate and transmit a fourth of the first gate signals to a fourth of the first gate lines coupled to a fourth pixel line of the pixel lines that is adjacent to the third pixel line, the second sub-drivers comprise:
a fifth sub-driver configured to generate and transmit a first of the second gate signals to a first of the second gate lines coupled to the first pixel line;
a sixth sub-driver configured to generate and transmit a second of the second gate signals to a second of the second gate lines coupled to the second pixel line;
a seventh sub-driver configured to generate and transmit a third of the second gate signals to a third of the second gate lines coupled to the third pixel line; and
an eighth sub-driver configured to generate and transmit a fourth of the second gate signals to a fourth of the second gate lines coupled to the fourth pixel line.

17. The scan driver of claim 16, wherein
the first sub-driver, the second sub-driver, the third sub-driver, and the fourth sub-driver are further configured to respectively sequentially receive a first sub-clock signal, a second sub-clock signal, a third sub-clock signal, and a fourth sub-clock signal, and to respectively sequentially transmit the first of the first gate signals, the second of the first gate signals, the third of the first gate signals, and the fourth of the first gate signals according to the first sub-clock signal, the second sub-clock signal, the third sub-clock signal, and the fourth sub-clock signal, respectively,
the fifth sub-driver, the sixth sub-driver, the seventh sub-driver, and the eighth sub-driver are further configured to respectively sequentially receive the second sub-clock signal, the third sub-clock signal, the fourth sub-clock signal, and the first sub-clock signal, and to respectively sequentially transmit the first of the second gate signals, the second of the second gate signals, the third of the second gate signals, and the fourth of the second gate signals according to the second sub-clock signal, the third sub-clock signal, the fourth sub-clock signal, and the first sub-clock signal, respectively.

18. The scan driver of claim 17, wherein
each of the first sub-clock signal, the second sub-clock signal, the third sub-clock signal, and the fourth sub-clock signal is driven with a period of four horizontal periods, and
the second sub-clock signal has a phase difference of one horizontal period with respect to the first sub-clock signal, the third sub-clock signal has a phase difference of one horizontal period with respect to the second clock signal and two horizontal periods with respect to the first clock signal, and the fourth sub-clock signal has a phase difference of two horizontal periods with respect to the second sub-clock signal.

19. The scan driver of claim 17, wherein
the first driver is configured to receive a first clock signal,
the second driver is configured to receive a second clock signal,
the first sub-driver, the second sub-driver, the third sub-driver, and the fourth sub-driver are further configured to respectively sequentially output the first of the first gate signals, the second of the first gate signals, the third of the first gate signals, and the fourth of the first gate signals after the first driver receives the first clock signal, and
the fifth sub-driver, the sixth sub-driver, the seventh sub-driver, and the eighth sub-driver are further configured to respectively sequentially output the first of the second gate signals, the second of the second gate signals, the third of the second gate signals, and the fourth of the second gate signals after the second driver receives the second clock signal.

20. The scan driver of claim 16, wherein
the first driver of a first stage of the stages and the first driver of a final stage of the stages are configured to receive a driving start signal, and
the fifth sub-driver of one of the first stage or the final stage is configured to transmit the first of the second gate signals of the one of the first stage or the final stage within one horizontal period after the first driver of the one of the first stage or the final stage has finished receiving the driving start signal.

21. The scan driver of claim 16, wherein
the first driver is configured to
receive a first initialization signal and
change a voltage value of the first common signal according to the received first initialization signal to stop an operation of the first sub-driver, the second sub-driver, the third sub-driver, and the fourth sub-driver, and
the second driver is configured to
receive a second initialization signal and
change a voltage value of the second common signal according to the received second initialization signal to stop the operation of the fifth sub-driver, the sixth sub-driver, the seventh sub-driver, and the eighth sub-driver.

22. A display device comprising:
a display unit comprising a plurality of pixels;
a scan driver configured to transmit a plurality of first gate signals and a plurality of second gate signals to the pixels;
a data driver configured to transmit image data signals to the pixels;
a light emission control driver configured to transmit light emission control signals to the pixels; and
a controller configured to generate a plurality of control signals to control driving of the scan driver, the data driver, and the light emission control driver,
wherein the scan driver comprises a plurality of stages, each of the stages comprising:
a plurality of first sub-drivers configured to generate ones of the first gate signals;
a plurality of second sub-drivers configured to generate ones of the second gate signals;
a first driver commonly coupled to the first sub-drivers and configured to concurrently supply a first common signal to each of the first sub-drivers; and
a second driver commonly coupled to the second sub-drivers and configured to concurrently supply a second common signal to each of the second sub-drivers,
wherein the first driver is configured to receive the second common signal of a previous one of the stages during forward direction driving or of a next one of the stages during reverse direction driving.

23. The display device of claim 22, wherein
the controller is configured to generate and transmit a forward direction driving control signal or a reverse direction driving control signal for determining a driving direction of the scan driver from among the control signals, and
the forward direction driving control signal and the reverse direction driving control signal are configured to be transmitted as fixed voltages having reversed polarities.

24. The display device of claim 22, wherein
the pixels are arranged in a plurality of pixel lines corresponding to the first sub-drivers of the stages and to the second sub-drivers of the stages,
the first sub-drivers are configured to transmit ones of the first gate signals to respective ones of the pixel lines, and
the second sub-drivers are configured to transmit ones of the second gate signals to the respective ones of the pixel lines.

25. The display device of claim 24, wherein
the first sub-drivers comprise:
   a first sub-driver configured to generate and transmit a first of the first gate signals to a first pixel line of the pixel lines; and
   a second sub-driver configured to generate and transmit a second of the first gate signals to a second pixel line of the pixel lines that is adjacent to the first pixel line,
the second sub-drivers comprise:
   a third sub-driver configured to generate and transmit a first of the second gate signals to the first pixel line; and
   a fourth sub-driver configured to generate and transmit a second of the second gate signals to the second pixel line.

26. The display device of claim 24, wherein
the first sub-drivers comprise four first sub-drivers respectively configured to generate and transmit ones of the first gate signals to four adjacent ones of the pixel lines, and
the second sub-drivers comprise four second sub-drivers respectively configured to generate and transmit ones of the second gate signals to the four adjacent ones of the pixel lines.

27. The display device of claim 24, wherein each of the first sub-drivers and the second sub-drivers comprises
   a boosting transistor configured to generate a respective one or the first gate signals or the second gate signals, and
   a capacitor comprising two terminals coupled between a gate and a source of the boosting transistor and configured to maintain a potential difference between the two terminals.

28. The display device of claim 22, wherein
the first gate signals are configured to initialize the pixels by resetting data voltages stored as gate voltages of driving transistors in the pixels according to image data signals transmitted to the pixels during a previous frame, and
the second gate signals are configured to
   control switching operation of switching transistors of the pixels for transmitting image data signals to the pixels during a current frame, and
   control switching operation of threshold voltage compensation transistors of the pixels.

29. The display device of claim 28, wherein the scan driver is further configured to generate and transmit each of the first gate signals to respective ones of the pixels earlier than generating and transmitting a respective one of the second gate signals to the respective ones of the pixels.

* * * * *